(12) United States Patent
Watanabe

(10) Patent No.: US 7,887,355 B2
(45) Date of Patent: Feb. 15, 2011

(54) SEMICONDUCTOR DEVICE SOCKET

(75) Inventor: Hideo Watanabe, Kawasaki (JP)

(73) Assignee: Yamaichi Electronics Co., Ltd., Tokyo (JP)

( * ) Notice: Subject to any disclaimer, the term of this patent is extended or adjusted under 35 U.S.C. 154(b) by 0 days.

(21) Appl. No.: 12/608,810

(22) Filed: Oct. 29, 2009

(65) Prior Publication Data

US 2010/0120272 A1    May 13, 2010

(30) Foreign Application Priority Data

Nov. 13, 2008    (JP) .............................. 2008-291445

(51) Int. Cl.
   *H01R 13/62* (2006.01)
(52) U.S. Cl. ........................................ 439/331; 439/73
(58) Field of Classification Search ................. 439/331, 439/526, 330, 73, 70, 266, 525, 268, 71, 439/206
See application file for complete search history.

(56) References Cited

U.S. PATENT DOCUMENTS

| | | |
|---|---|---|
| 4,420,205 A | 12/1983 | Kirkman |
| 4,739,257 A | 4/1988 | Jenson et al. |
| 4,927,369 A | 5/1990 | Grabble et al. |
| 5,073,117 A | 12/1991 | Malhi et al. |
| 5,147,213 A | 9/1992 | Funk et al. |
| 5,249,972 A | 10/1993 | Walker |
| 5,281,160 A | 1/1994 | Walkup et al. |
| 5,342,213 A | 8/1994 | Kobayashi |
| 5,342,214 A | 8/1994 | Hsu |
| 5,458,499 A | 10/1995 | Matsuoka |
| 5,470,247 A | 11/1995 | Fuchigami |
| 5,482,471 A | 1/1996 | Mori et al. |
| 5,518,410 A | 5/1996 | Masami |
| 5,519,882 A | 5/1996 | Asano et al. |
| 5,531,608 A | 7/1996 | Abe |
| 5,573,427 A | 11/1996 | Sagano |
| 5,611,705 A | 3/1997 | Pfaff |
| 5,697,795 A | 12/1997 | Abe |
| 5,727,954 A | 3/1998 | Kato et al. |

(Continued)

FOREIGN PATENT DOCUMENTS

EP        0213819 A2    3/1987

(Continued)

OTHER PUBLICATIONS

Office Action dated Dec. 26, 2008 in corresponding Japanese Patent Application No. 2006-043171.

(Continued)

*Primary Examiner*—Edwin A. Leon
(74) *Attorney, Agent, or Firm*—Finnegan, Henderson, Farabow, Garrett & Dunner, LLP

(57) ABSTRACT

A pressing member has a pressing section capable of pressing semiconductor devices with different shapes having an external shape within a predetermined range. The pressing section is held, via a coupling pin, by paired arm members coupled to paired lever members rotationally movably supported by a socket main body section. When the pressing member is in a pressing state, the opposite ends of the coupling pin are held by a circular arc surface portion of holding walls. When the pressing member is in a standby state, the opposite ends of the coupling pin are disengaged from the circular arc surface portion of the holding walls.

11 Claims, 27 Drawing Sheets

U.S. PATENT DOCUMENTS

| | | | |
|---|---|---|---|
| 5,807,104 A | 9/1998 | Ikeya et al. | |
| 5,885,101 A | 3/1999 | Matsuoka et al. | |
| 5,923,179 A | 7/1999 | Taylor | |
| 5,989,039 A | 11/1999 | Sik | |
| 6,027,355 A | 2/2000 | Ikeya | |
| 6,106,319 A * | 8/2000 | Fukunaga et al. | 439/342 |
| 6,126,467 A | 10/2000 | Ohashi | |
| 6,149,449 A | 11/2000 | Abe | |
| 6,155,859 A | 12/2000 | Choy | |
| 6,162,066 A | 12/2000 | Glick et al. | |
| 6,213,806 B1 | 4/2001 | Choy | |
| 6,220,869 B1 | 4/2001 | Grant et al. | |
| 6,243,267 B1 | 6/2001 | Chuang | |
| 6,261,114 B1 | 7/2001 | Shimada | |
| 6,280,219 B1 | 8/2001 | Sano et al. | |
| 6,280,222 B1 | 8/2001 | Walkup | |
| 6,283,780 B1 | 9/2001 | Yamamoto et al. | |
| 6,296,505 B1 | 10/2001 | Fukunaga et al. | |
| 6,322,384 B1 | 11/2001 | Ikeya | |
| 6,328,587 B1 | 12/2001 | Hsu | |
| 6,350,138 B1 | 2/2002 | Atobe et al. | |
| 6,371,782 B1 | 4/2002 | Ohashi | |
| 6,383,002 B1 | 5/2002 | Ohashi | |
| 6,402,537 B2 | 6/2002 | Ikeya | |
| 6,443,741 B1 | 9/2002 | Watanabe | |
| 6,461,182 B1 | 10/2002 | Hsu | |
| 6,464,511 B1 | 10/2002 | Watanabe et al. | |
| 6,517,370 B2 | 2/2003 | Fukunaga | |
| 6,561,831 B1 | 5/2003 | McHugh et al. | |
| 6,567,866 B1 | 5/2003 | Poisner | |
| 6,609,923 B2 | 8/2003 | Sato et al. | |
| 6,676,431 B2 | 1/2004 | Kukita et al. | |
| 6,707,309 B2 | 3/2004 | Sato et al. | |
| 6,709,279 B2 | 3/2004 | Uratsuji | |
| 6,733,320 B2 | 5/2004 | Kukita et al. | |
| 6,739,894 B2 | 5/2004 | Ogura | |
| 6,752,645 B2 | 6/2004 | Nakamura et al. | |
| 6,758,684 B2 | 7/2004 | Oikawa et al. | |
| 6,776,641 B2 | 8/2004 | Hachuda | |
| 6,776,643 B2 | 8/2004 | Nakano | |
| 6,790,065 B2 * | 9/2004 | Fukunaga | 439/266 |
| 6,793,512 B2 | 9/2004 | Abe et al. | |
| 6,796,823 B1 | 9/2004 | Nakano et al. | |
| 6,960,092 B1 | 11/2005 | Hussain et al. | |
| 6,976,852 B2 | 12/2005 | Azumi et al. | |
| 6,976,863 B2 | 12/2005 | Sato | |
| 7,118,386 B2 | 10/2006 | Sato et al. | |
| 7,165,978 B2 | 1/2007 | Sato et al. | |
| 7,204,708 B2 | 4/2007 | Sato et al. | |
| 7,278,868 B2 * | 10/2007 | Sato et al. | 439/259 |
| 2004/0248435 A1 | 12/2004 | Sato et al. | |
| 2004/0253862 A1 | 12/2004 | Masaki et al. | |
| 2006/0043990 A1 | 3/2006 | Sato | |
| 2006/0228915 A1 | 10/2006 | Sato et al. | |
| 2007/0007984 A1 | 1/2007 | Kojima et al. | |

FOREIGN PATENT DOCUMENTS

| | | |
|---|---|---|
| EP | 0 969 710 A2 | 1/2000 |
| EP | 0 969 711 A2 | 1/2000 |
| EP | 1 111 724 A2 | 6/2001 |
| JP | 57-125632 | 1/1984 |
| JP | 60-189977 | 12/1985 |
| JP | 62-160676 | 7/1987 |
| JP | 63-299257 | 12/1988 |
| JP | 01-81887 | 5/1989 |
| JP | 02-049381 | 2/1990 |
| JP | 02-119378 | 5/1990 |
| JP | 03-072548 | 3/1991 |
| JP | 03-257994 | 11/1991 |
| JP | 04-072927 | 3/1992 |
| JP | 04-135190 | 5/1992 |
| JP | 04-308676 | 10/1992 |
| JP | 05-11374 | 1/1993 |
| JP | 05-029050 | 2/1993 |
| JP | 05-047445 | 2/1993 |
| JP | 05-020286 | 3/1993 |
| JP | 06-020752 | 1/1994 |
| JP | 06-020753 | 1/1994 |
| JP | 06-203936 | 7/1994 |
| JP | 06-290839 | 10/1994 |
| JP | 6-310233 | 11/1994 |
| JP | 07-239362 | 9/1995 |
| JP | 08-046335 | 2/1996 |
| JP | 08-138812 | 5/1996 |
| JP | 8-185944 | 7/1996 |
| JP | 8-185945 | 7/1996 |
| JP | 08-213088 | 8/1996 |
| JP | 08-222335 | 8/1996 |
| JP | 08-273777 | 10/1996 |
| JP | 09-55273 | 2/1997 |
| JP | 09-092421 | 4/1997 |
| JP | 2665419 B2 | 6/1997 |
| JP | 09-199217 | 7/1997 |
| JP | 09-199250 A | 7/1997 |
| JP | 09-211067 | 8/1997 |
| JP | 09-245920 | 9/1997 |
| JP | 10-073635 | 3/1998 |
| JP | 10-256764 | 9/1998 |
| JP | 10-302925 | 11/1998 |
| JP | 11-02126 | 1/1999 |
| JP | 11-097818 | 4/1999 |
| JP | 11-111419 | 4/1999 |
| JP | 11-126671 | 5/1999 |
| JP | 11-162602 | 6/1999 |
| JP | 11-238566 | 8/1999 |
| JP | 02-973406 | 9/1999 |
| JP | 11-329643 | 11/1999 |
| JP | 2000-048923 | 2/2000 |
| JP | 2000-113954 | 4/2000 |
| JP | 2000-133390 | 5/2000 |
| JP | 2000-150092 | 5/2000 |
| JP | 2000-182739 | 6/2000 |
| JP | 2000-182740 | 6/2000 |
| JP | 2000-340324 A | 12/2000 |
| JP | 2001-043462 | 2/2001 |
| JP | 2001-043947 | 2/2001 |
| JP | 2001-066346 | 3/2001 |
| JP | 2001-91577 | 4/2001 |
| JP | 2001-115037 | 4/2001 |
| JP | 2001-151234 | 6/2001 |
| JP | 2001-185313 | 7/2001 |
| JP | 2001-326045 | 11/2001 |
| JP | 2001-522523 | 11/2001 |
| JP | 3257994 B | 12/2001 |
| JP | 2002-063975 | 2/2002 |
| JP | 2002-202344 | 7/2002 |
| JP | 2002-202729 | 7/2002 |
| JP | 2002-231398 | 8/2002 |
| JP | 2002-313510 | 10/2002 |
| JP | 2002-314005 | 10/2002 |
| JP | 2003-007942 | 1/2003 |
| JP | 2003-017207 | 1/2003 |
| JP | 2003-035745 | 2/2003 |
| JP | 2003-45591 | 2/2003 |
| JP | 2003-59602 | 2/2003 |
| JP | 2003-123923 | 4/2003 |
| JP | 2003-123924 | 4/2003 |
| JP | 2003-123925 | 4/2003 |
| JP | 2003-123926 | 4/2003 |
| JP | 2003-217771 | 7/2003 |
| JP | 2003-308940 | 10/2003 |
| JP | 2004-014873 | 1/2004 |
| JP | 2004-079227 | 3/2004 |

| | | |
|---|---|---|
| JP | 2004-111215 | 4/2004 |
| JP | 2004-214177 | 7/2004 |
| JP | 2004-227907 | 8/2004 |
| JP | 2004-355983 | 12/2004 |
| JP | 2005-26213 | 1/2005 |
| JP | 2005-037156 | 2/2005 |
| JP | 2005-174670 | 6/2005 |
| JP | 2005-276843 | 10/2005 |
| JP | 2006-294281 | 10/2006 |
| JP | 2007-017234 | 1/2007 |
| JP | 2007-500426 | 1/2007 |
| JP | 04-109543 | 4/2008 |
| WO | WO 03/030604 A1 | 4/2003 |
| WO | WO 03/031994 A1 | 4/2003 |

OTHER PUBLICATIONS

Office Action dated Jan. 7, 2009 in corresponding Korean Patent Application No. 10-2007-0090311.

Office Action dated Oct. 23, 2007 in corresponding Japanese Patent Application No. 2004-253342.

Official Action from German Patent Office for corresponding German Patent Application No. 10223502.3-55.

Official Letter from Japanese Patent Office, dated Jul. 31, 2009, for corresponding Japanese Patent Application No. 2007-256211.

Official Letter from Korean Patent Office, dated Sep. 18, 2004, for corresponding Korean Patent Application No. 10-2002-0038155.

\* cited by examiner

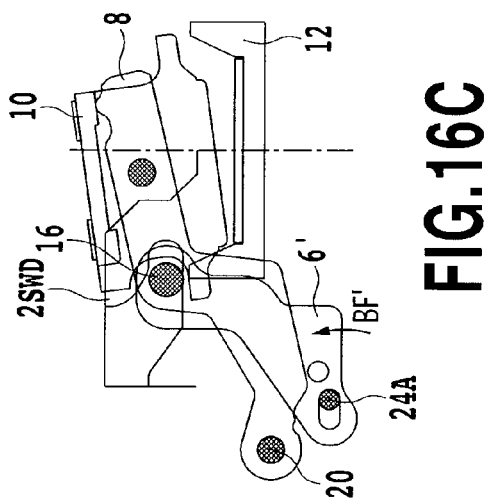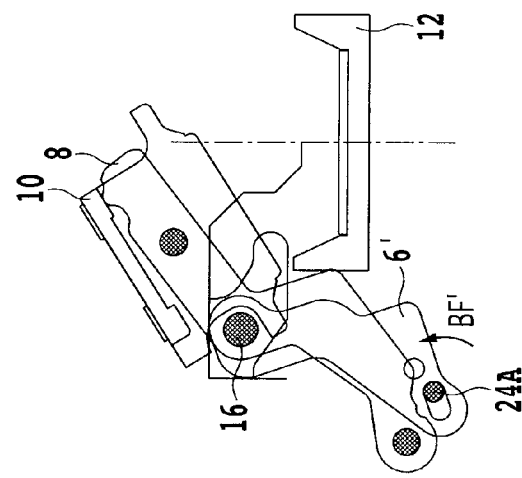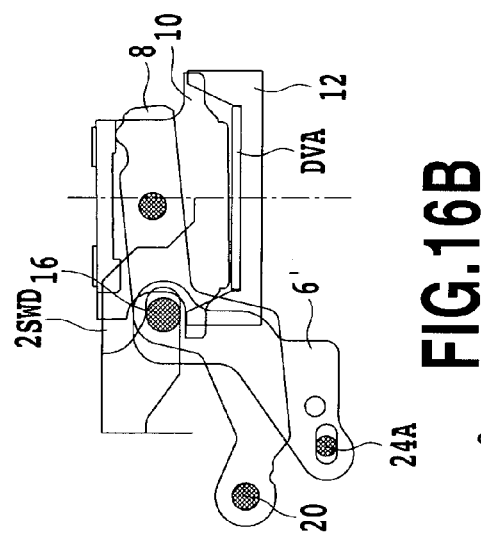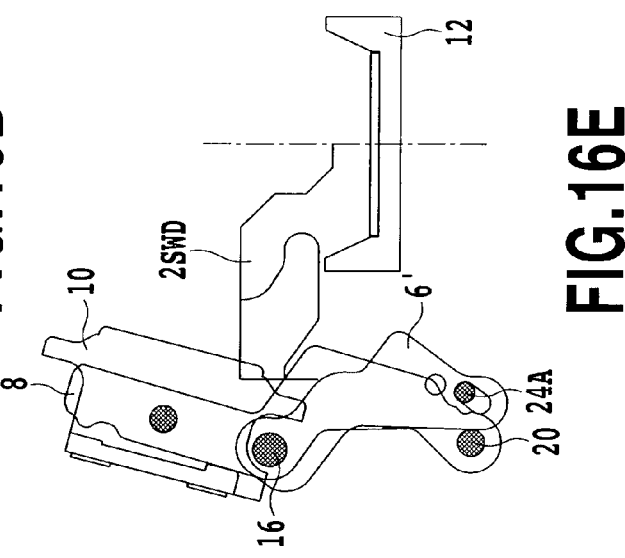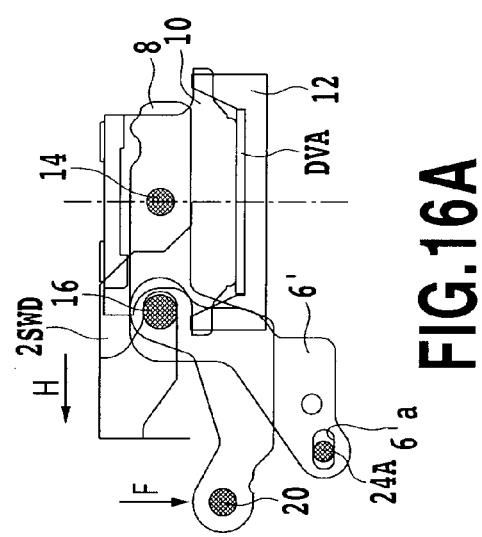

SEMICONDUCTOR DEVICE SOCKET

CROSS-REFERENCE TO RELATED APPLICATIONS

This application claims the benefit of Japanese Patent Application No. 2008-291445 filed Nov. 13, 2008 which is hereby incorporated by reference herein in its entirety.

BACKGROUND OF THE INVENTION

1. Field of the Invention

The present invention relates to a semiconductor device socket capable of accommodating each of a plurality of semiconductor devices with different shapes and sizes in a detachable manner.

2. Description of the Related Art

For a semiconductor device mounted in an electronic equipment or the like, in order to remove potential defects in the semiconductor device at a stage before mounting, for example, burn-in tests, which are effective for excluding integrated circuits with infant mortality failures, are generally carried out via a semiconductor device socket.

A semiconductor socket made available for using for such tests is commonly referred to as an IC socket and is located on a printed wiring board (test board) as disclosed in, for example, Japanese Patent Laid-Open No. 2003-59602. As disclosed in, for example, Japanese Patent Laid-Open No. 2003-59602, the semiconductor device socket includes, as main components, a socket main body section having a semiconductor device accommodating section accommodating a semiconductor device in a detachable manner, contact pins provided in the semiconductor device accommodating section of the socket main body section and electrically connecting terminal sections of the semiconductor device to electrode sections of the printed wiring board, a cover member capable of raising and lowering with respect to the socket main body section, a latch mechanism including pressing members rotationally moved in conjunction with raising and lowering of the cover member, and an elastic member biasing the cover member in a direction in which the cover member separates from the socket main body section.

Two link mechanisms are provided respective opposite positions around the periphery of the semiconductor device accommodating section. One end of the pressing member support member constituting a part of the latch mechanism is coupled to each of the link mechanisms. A pressing member is provided at the other end of each of the pressing member support members.

When the cover member is at the uppermost position, the bias force of the elastic member acts on the pressing member support member via the cover member and the link mechanism. Thus, each pressing member is brought into contacting, under a predetermined pressure, with the common top surface of the semiconductor device placed in the semiconductor device accommodating section. This causes the terminal sections of the semiconductor device to be pressed against contact sections of the respective contact pins at a predetermined pressure.

On the other hand, if the cover member is pressed against the bias force of the elastic member so as to move closer to the socket main body section, the pressing member provided at the other end of the pressing member support member is rotationally moved to a predetermined standby position via the link mechanism so as to go away from the semiconductor device accommodating section.

In view of standardization of test facilities, square semiconductor devices externally differently sized so as to be, for example, between 10 mm and 25 mm on a side may need to be tested using a common semiconductor device socket regarding the semiconductor device socket.

When common pressing members and a common pressing member support member allow semiconductor devices with different external sizes to be pressed by the bias force of a predetermined elastic member, the length of the pressing member support member may be set such that the pressing member provided at the other end of the pressing member support member can press a semiconductor device with the minimum external size. In this case, a pressing force stronger than that corresponding to the semiconductor device with the minimum external size needs to be exerted on a semiconductor device with the maximum external size because the latter semiconductor device has more terminals than the former semiconductor device.

In case of increasing a pressing force, as shown in Japanese Patent Laid-Open No. 2005-174670, there has been proposal in which a touching portion of a pressing lever member is configured to move rotationally so as to touch to the top surface of the semiconductor device after the pressing lever member moves forward in conjunction with a lowering operation of a cover member so as to push down a pedestal on which the semiconductor device is placed, under a lever ratio being changed such that the length from the support point pin of the pressing lever member to the touching portion is shorter than the distance from the support point pin to a coupling pin.

SUMMARY OF THE INVENTION

However, if the length of the pressing member support member is set so as to be able to press the semiconductor device with the minimum external size as described above, it may be difficult to move the position of the support pin closer to the touching portion to change the lever ratio as disclosed in Japanese Patent Laid-Open No. 2005-174670, in order to increase the pressing force. Therefore, there is a risk that the appropriate pressing force is not exerted on the semiconductor device with the maximum external size by means of the bias force of the predetermined elastic member via the common pressing members and pressing member support member.

Furthermore, in Japanese Patent Laid-Open No. 2005-174670, it is difficult to set the rotational movement angle of the pressing lever member and touching portion to be larger than in the case of a semiconductor device with the minimum external size such that the touching portion does not interfer with a detachable/attachable semiconductor device with the maximum external size when the touching portion is at the standby position unless the sizes of the cover member and the socket main body or the like increase even further when the length of the pressing member support member is set so as to be able to press the semiconductor device with the minimum external size.

In view of the above-described problems, the present invention aims to provide a semiconductor device socket capable of accommodating each of a plurality of semiconductor devices with different shapes and sizes in a detachable manner. The semiconductor device socket can exert the appropriate pressing force on each of the semiconductor devices without depending on the shape or size of each semiconductor device.

To achieve the above-described object, the present invention provides a semiconductor device socket comprising a socket main body section having a semiconductor device placement section in which a plurality of semiconductor devices with different shapes and sizes are placed in a detachable manner, a lever member one end of which is rotationally movably supported by the socket main body section and which has an engagement section at least one of the one and other ends thereof, an arm member coupled to the other end of the lever member via a coupling portion, a pressing member supported by the arm member at a position closer to a tip of the arm member before a position to which the coupling portion is coupled, the pressing member having a pressing section corresponding to the plurality of semiconductor devices with the different shapes and sizes, and a cover member supported so as to be able to raise and lower with respect to the socket main body section and coupled to other end of the arm member, wherein if the pressing section of the pressing member presses the semiconductor device in response to an operation of the cover member, the pressing section in a pressing state is kept, resulting from one end of the coupling portion being engaged with an engagement groove in the socket main body section and if the pressing member is in a standby state in which the pressing member keeps away from the semiconductor device placement section, the one end of the coupling portion is disengaged from the engagement groove in the socket main body section.

Furthermore, the present invention provides a semiconductor device socket comprising a socket main body section having a semiconductor device placement section in which a plurality of semiconductor devices with different shapes and sizes are placed in a detachable manner, a first lever member and a second lever member arranged opposite each other across the semiconductor device placement section, one end of each of the first and second lever members being rotationally movably supported by the socket main body section, each of the first and second lever members having an engagement section at least one of the one and other ends thereof, a first arm member and a second arm member coupled to the other ends of the first and second lever members, respectively, via coupling portions, a first pressing member supported by the first arm member at a position closer to a tip of the first arm member than a position to which the coupling portion is coupled, the first pressing member having a pressing section corresponding to the plurality of semiconductor devices with the different shapes and sizes, a second pressing member supported by the second arm member at a position closer to a tip of the second arm member than a position to which the coupling portion is coupled, the second pressing member having a pressing section corresponding to the plurality of semiconductor devices with the different shapes and sizes, and a cover member supported so as to be able to raise and lower with respect to the socket main body section and coupled to other ends of the first and second arm members, wherein if the pressing sections of the first and second pressing members cooperatively press the semiconductor devices in response to an operation of the cover member, the pressing sections of the first and second pressing members in a pressing state is kept, resulting from one end of the coupling portion being engaged with an engagement groove in the socket main body section, and if the pressing member is in a standby state in which the first and second pressing members keep away from the semiconductor device placement section, the one end of the coupling portion is disengaged from the engagement groove in the socket main body section.

According to the semiconductor device socket in accordance with the present invention, the present invention comprises the socket main body section having the semiconductor device placement section in which the plurality of semiconductor devices with the different shapes and sizes are placed in a detachable manner and the pressing member having the pressing section supported by the arm member at the position closer to the tip of the arm member before the position to which the coupling portion is coupled, the pressing section corresponding to the plurality of semiconductor devices with the difference shapes and sizes. If the pressing section of the pressing member presses the semiconductor device in response to the operation of the cover member, resulting from one end of the coupling portion being engaged with the engagement groove in the socket main body section, the pressing section in the pressing state is kept. Thus, the appropriate pressing force can be exerted on each of the semiconductor devices without depending on the shape or size of the semiconductor device.

Further features of the present invention will become apparent from the following description of exemplary embodiments (with reference to the attached drawings).

BRIEF DESCRIPTION OF THE DRAWINGS

FIG. 16A to FIG. 16E are diagrams made available for explaining operations in the example shown in FIG. 2A, the operations being performed when the lever member shown in FIG. 15 is utilized;

DESCRIPTION OF THE EMBODIMENTS

Figure 2A:
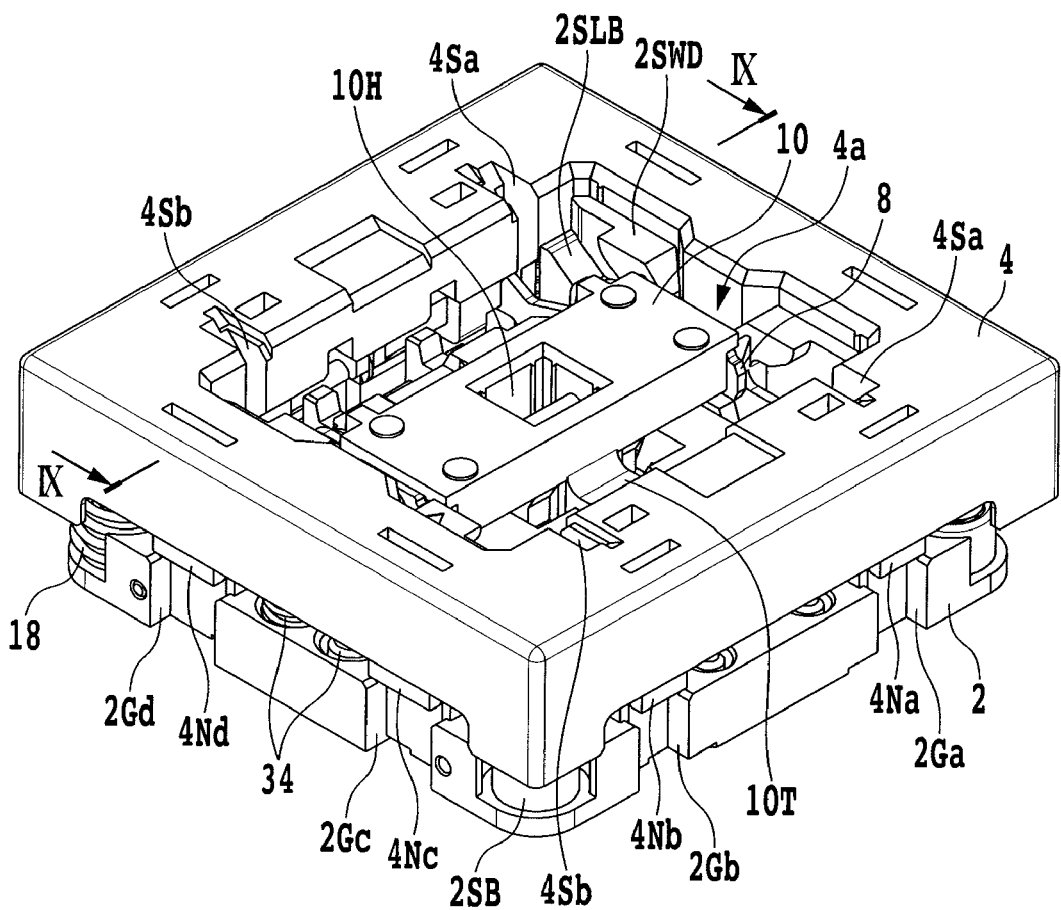
FIG. 2A is a perspective view showing the appearance of the first embodiment of the semiconductor device socket according to the present invention.

FIG. 2A shows the appearance of a first embodiment of a semiconductor device socket according to the present invention.

In FIG. 2A, a plurality of semiconductor device sockets are arranged at a predetermined position on a printed wiring board PB (see FIG. 7) in a matrix. Note that FIG. 2A typically shows one semiconductor device socket.

The semiconductor device socket comprises a positioning member 12 (see FIG. 1) having an accommodation section accommodating a semiconductor device DVA in a detachable manner, a socket main body section 2 (see FIG. 5A) having a recess portion 2A in which the positioning member 12 is removably mounted, a cover member 4 capable of raising and lowering with respect to the socket main body section 2, a plurality of pins $30ai$ (i=1 to n; n is a positive integer) (see FIG. 7) electrically connecting a terminal section of the semiconductor device DVA placed in the accommodation section of the above-described positioning member 12 to an electrode section of the printed wiring board PB, and a pressure holding mechanism including a pressing member 10 pressing the terminal section of the semiconductor device DVA against the plurality of contact terminals $30ai$ under a predetermined pressure.

The printed wiring board PB includes a group of electrodes formed on a front layer section thereof corresponding to the group of contact terminals $30ai$ on the socket main body section 2. The electrode group is electrically connected to a signal I/O section of the printed wiring board PB which inputs and outputs test signals through a conductor layer (not shown).

The semiconductor device DVA is of, for example, several types, including a BGA (Ball Grid Array) type, an LGA (Land Grid Array) type, or a QFN (Quad Flat Non-leaded) type. The outside dimension of the mountable semiconductor device DVA is, for example, in the range of not less than 10 mm nor more than 25 mm on a side. That is, by replacing the positioning member 12 described below with one corresponding to the external size of the semiconductor device DVA, a semiconductor device with a different external shape can be loaded in the socket main body section 2.

Figure 1:
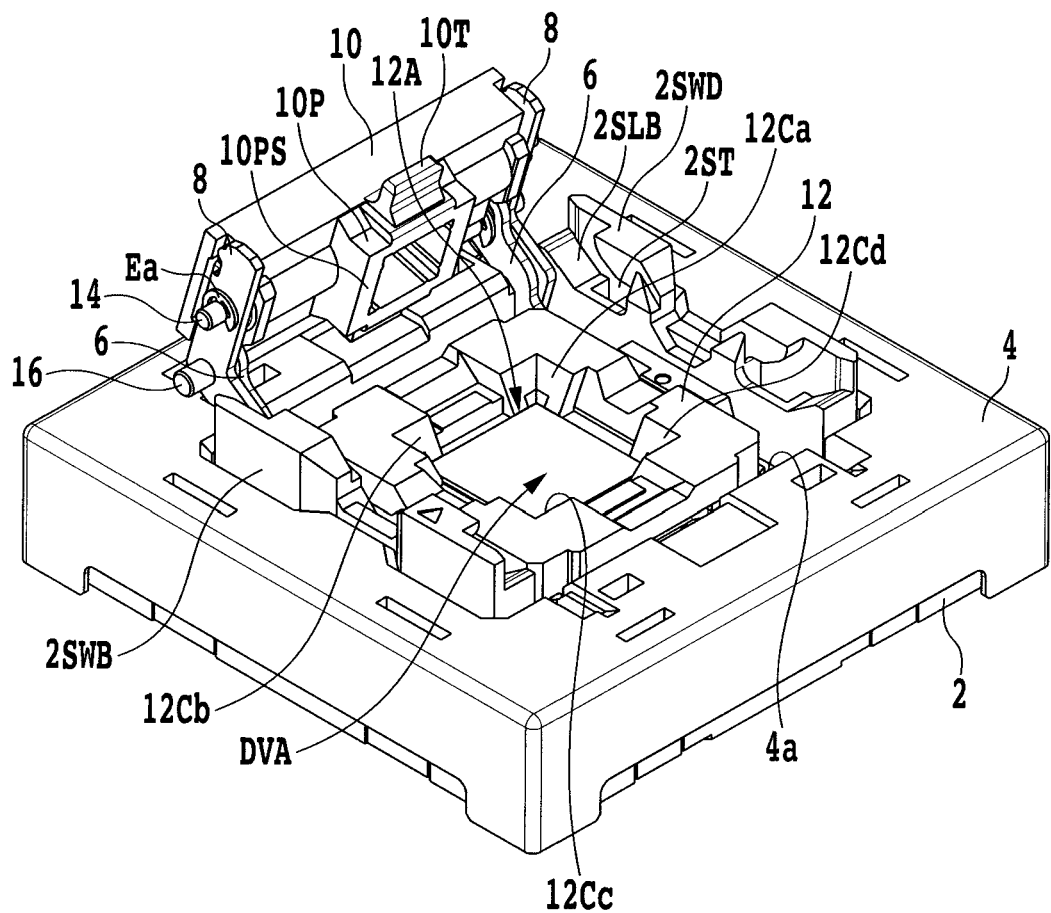
FIG. 1 is a perspective view showing the appearance of a first embodiment of a semiconductor device socket according to the present invention.
Figure 9:
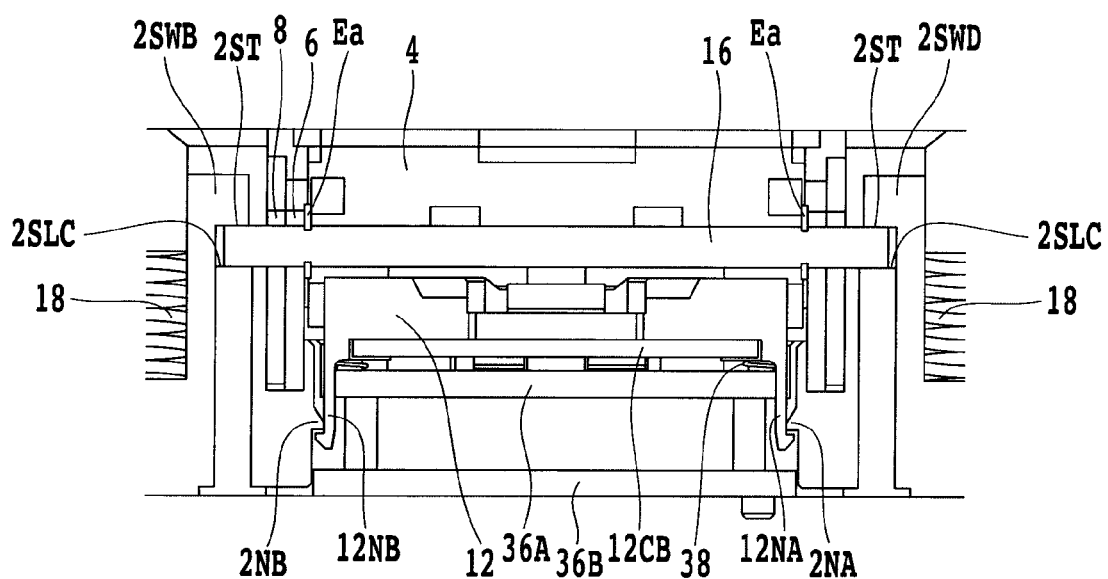
FIG. 9 is a partial sectional view taken along line IX-IX in FIG. 2A.

As shown in FIG. 1, the positioning member 12 has a generally square semiconductor device placement section 12A located in a central portion thereof and in which the semiconductor device DVA is placed in a detachable manner. Guide walls 12Ca, 12Cb, 12Cc, and 12Cd for guiding and engaging with the corners of the semiconductor device DVA are formed in the four corners of a wall section forming the semiconductor device placement section 12A, respectively. As shown in FIG. 9, the positioning member 12 is provided with a pair of elastically deformable opposite nib portions 12NA and 12NB. The nib portions 12NA and 12NB are fixed on respective paired opposite protrusion sections 2NA and 2NB provided on an inner wall section forming the recess portion 2A of the socket main body section 2. Thus, the positioning member 12 is held on the periphery of the recess portion 2A so as to be able to raise and lower. The paired opposite nib portions 12NA and 12NB are also formed on the other opposite sides of the positioning member 12.

The positioning member 12 can be disengaged from the recess portion 2A of the socket main body section 2 described below with the nib portions 12NA and 12NB removed from the protrusion sections 2NA and 2NB against the elastic force of the nib portions 12NA and 12NB in itself.

Figure 6:
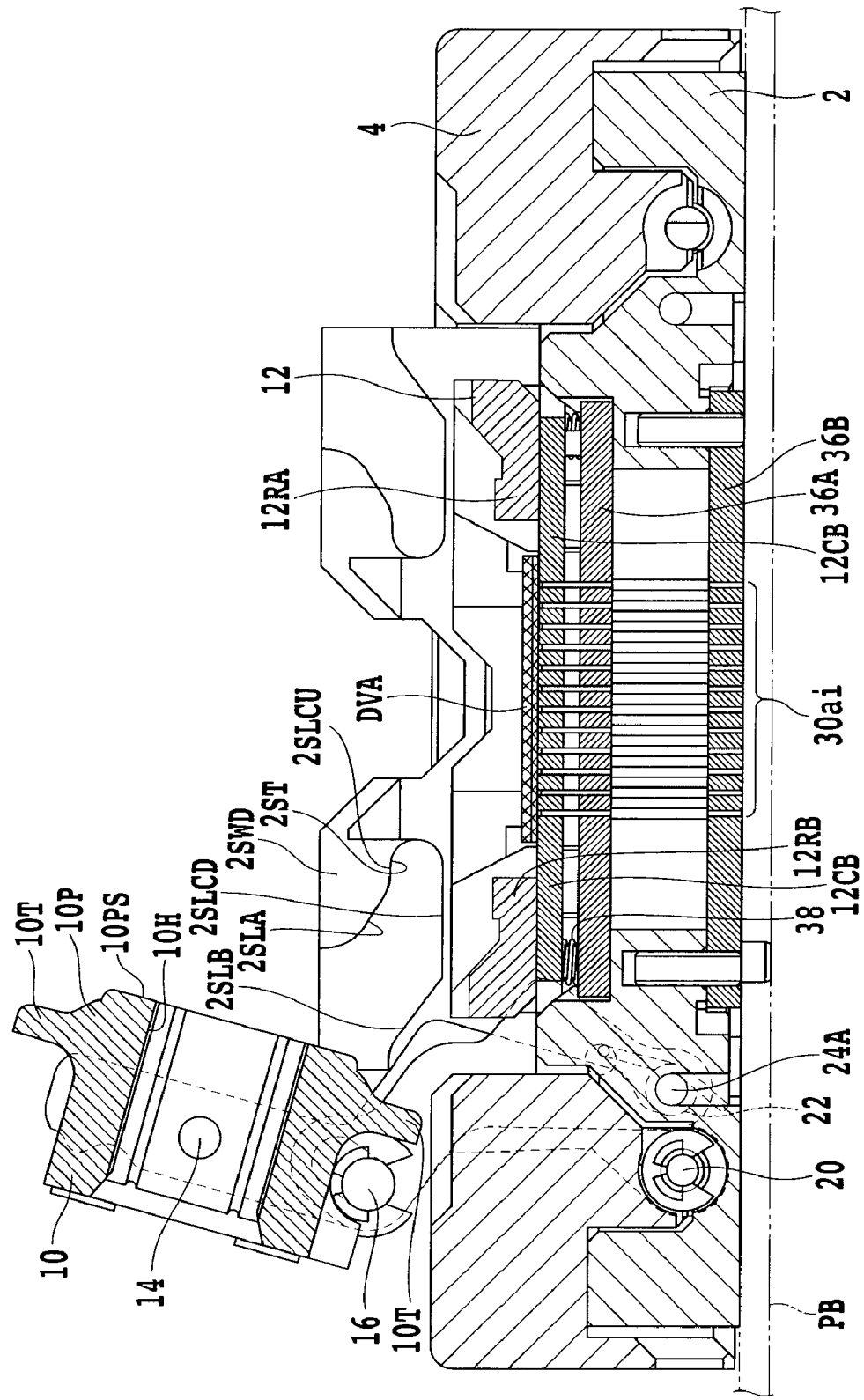
FIG. 6 is a sectional view of the example shown in FIG. 1.

As shown in FIG. 6, pores are formed in a bottom wall section 12CB forming a bottom portion of the semiconductor device placement section 12A of the positioning member 12. One end of each of the contact terminals $30ai$ is movably installed into the corresponding one of the pores. The plurality of pores are formed in a matrix in a plane corresponding to the array of the contact terminals $30ai$. Each of the contact terminals $30ai$ has paired terminals which is movable through a sleeve and which are biased by a coil spring. The contact terminals $30ai$ are not limited to this example but may be contact pins having elastically deformable bent portions as disclosed in, for example, Japanese Patent Laid-Open No. 2005-174670.

Under the bottom wall section 12CB, terminal support substrates 36A and 36B are arranged in the socket main body section 2. The terminal support substrates 36A and 36B are secured to the socket main body section 2 so as to cooperatively sandwich the opposite ends of each of the plurality of contact terminals $30ai$ between the terminal support substrates 36A and 36B. Each of the plurality of contact terminals $30ai$ is sandwiched between the terminal support substrates 36A and 36B so that the central axis of the contact terminal $30ai$ is generally orthogonal to the flat surfaces of the terminal support substrates 36A and 36B.

Furthermore, four coil springs 38 are disposed between the bottom wall section 12CB and the terminal support substrate 36A, the coil springs 38 being wound around respective shafts provided in the corresponding four corners of the bottom wall section 12CB. The coil springs 38 bias the positioning member 12 so that the positioning member 12 separates from the terminal support substrate 36A. The biased positioning member 12 is held at the uppermost position shown in FIG. 6 with the nib portions 12NA and 12NB fixed on the projection portions 2NA and 2NB, respectively, of the socket main body 2, described above.

Figure 7:
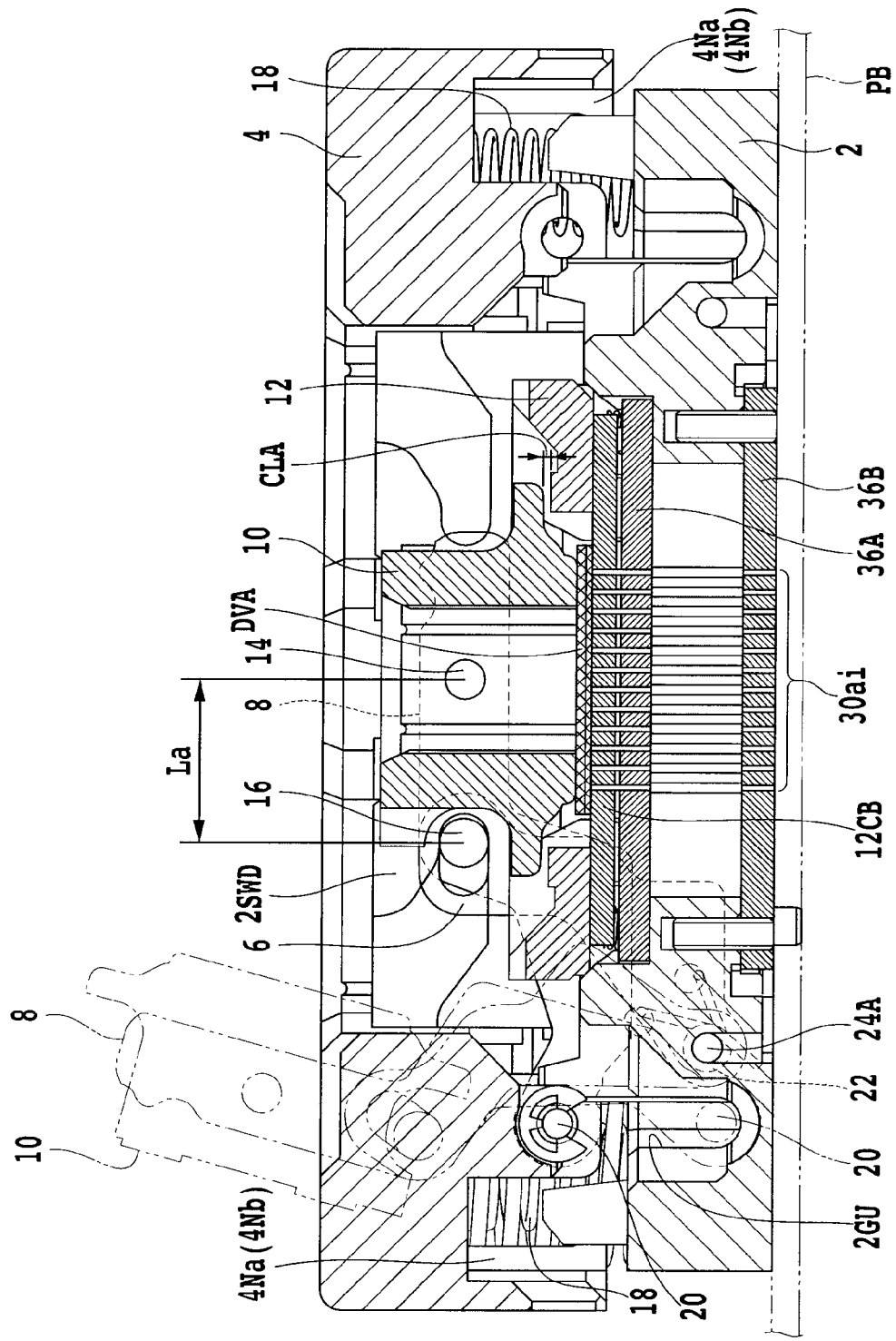
FIG. 7 is a sectional view of the example shown in FIG. 2A.

That is, when the semiconductor device DVA placed in the semiconductor device placement section 12A is not pressed as shown in FIG. 6, the bottom wall section 12CB keeps away from the terminal support substrate 36A. Thus, one end of each of the contact terminals $30ai$ is prevented from projecting from the corresponding pore in the bottom wall section 12CB. On the other hand, when the semiconductor device DVA placed in the semiconductor device placement section 12A is pressed as shown in FIG. 7, the bottom wall section 12CB is placed in proximity to the terminal support substrate 36A. Thus, the one end of each of the contact terminals $30ai$ in the respective pores in the bottom wall section 12CB touches on the terminal of the semiconductor device DVA.

Figure 5A:
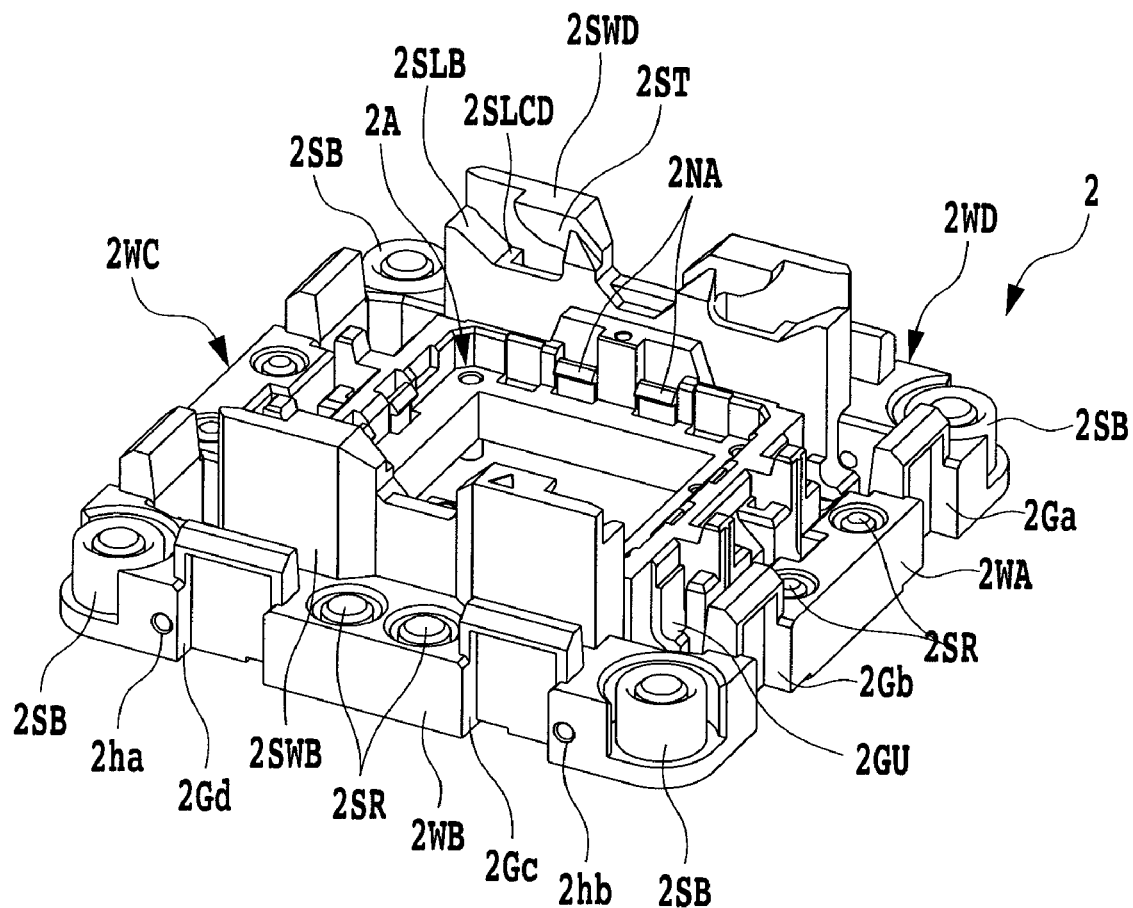
FIG. 5A is a perspective view showing the socket main body section provided in the example shown in FIG. 2A.

As shown in FIG. 5A, the socket main body section 2 has outer shell walls 2WA, 2WB, 2WC, and 2WD around the periphery of the recess portion 2A. The outer shell wall 2WA has guide grooves 2Ga and 2Gb formed parallel to each other with a predetermined distance therebetween and through which nib portions 4Na and 4Nb, respectively, of the cover member as described later are guided. The outer shell wall 2WB has guide grooves 2Gd and 2Gc formed parallel to each other with a predetermined distance therebetween and through which nib portions 4Nd and 4Nc, respectively, of the cover member as described later are guided. Each of the outer shell walls 2WC and 2WD also has guide grooves formed parallel to each other with a predetermined distance therebetween and through which nib portions of the cover member are guided.

Holes 2*ha* and 2*hb* in which support shafts 24A and 24B as described later are inserted, are formed adjacent to the guide grooves 2Gd and 2Gc, respectively.

Spring receivers 2SB are each integrally formed in a corresponding one of corner potions coupling the outer shell walls 2WA, 2WB, 2WC, and 2WD together to receive one end of a coil spring 18 described below. Paired spring receivers 2SR are formed between the guide grooves in each of the outer shell walls 2WA, 2WB, 2WC, and 2WD so that each of the spring receiver 2SR receives one end of a sub-coil spring 34. A guide groove 2GU (see FIGS. 5A and 7) for guiding a coupling pin 20 described below is formed between the outer shell wall 2WA and the recess portion 2A and between the outer shell wall 2WC and the recess portion 2A. Furthermore, a holding wall 2SWB is formed between the outer shell wall 2WB and the recess portion 2A. A holding wall 2SWD is formed between the outer shell wall 2WD and the recess portion 2A.

The holding wall 2SWB and the holding wall 2SWD are symmetrically formed opposite each other across the recess portion 2A. Thus, the holding wall 2SWD will be described, and the description of the holding wall 2SWB is omitted.

As shown in FIG. 7, the holding wall 2SWD has paired engagement grooves in which a coupling pin 16 described below is held. In the example shown in FIG. 2A, only one of the engagement grooves is utilized. However, both engagement grooves may be utilized as in an example shown in FIG. 21 described below.

As shown in FIG. 5A, an intrusion path through which the coupling pin 16 enters the left side engagement groove in FIG. 5A is open leftward. On the other hand, an intrusion path through which the coupling pin 16 enters the right engagement groove in FIG. 5A is open rightward. The structures of the left and right engagement grooves are the same each other except for the opening direction of the intrusion path. Thus, the structure of the left engagement groove will be described, and the description of the right engagement groove is omitted.

As shown enlarged in FIG. 6, the engagement groove is composed of a slope portion 2SLB forming a bottom portion of the intrusion path, a lower flat surface portion 2SLCD continuing with the root of the slope portion 2SLB, a circular arc surface portion 2ST continuing with the lower flat surface portion 2SLD so as to form a closed end, an upper flat surface portion 2SLCU continuing with the upper end of the circular arc surface portion 2ST and formed generally parallel to the lower flat surface portion 2SLCD, and a bent surface portion 2SLA continuing with the upper flat surface portion 2SLCU and formed immediately above the lower flat surface portion 2SLCD. A portion located immediately above the slope portion 2SLB adjacent to the bent surface portion 2SLA is opened. When the semiconductor device DVA is pressed, the circular arc surface portion 2ST and/or the upper flat surface portion 2SLCU hold the coupling pin 16 at a predetermined position as shown in FIGS. 7 and 9. Although as described above, the engagement groove has the circular arc surface portion 2ST continuing with the lower flat surface portion 2SLD so as to form a closed end, the present invention is not limited to this example. For example, the engagement groove may be formed such that instead of the circular arc surface portion 2ST, a portion corresponding to the circular arc surface portion 2ST is open.

The cover member 4 surrounding a circumference of the positioning member 12 has an opening 4*a* located in the center thereof and through which the positioning member 12 or the holding walls 2SWD and 2SWB selectively pass. As shown in FIGS. 1 and 2A, the cover member 4 is supported so as to be able to raise and lower with respect to the socket main body section 2. When the cover member 4 is at the uppermost position, the tip of each of the nib portions 4Na and 4Nb, 4Nc and 4Nd of the cover member 4 projecting toward the socket main body 2 engages with a fixing end of the corresponding one of the guide grooves 2Ga to 2Gd of the socket main body section 2 as shown in FIGS. 2A and 7. FIG. 2A shows a state in which the cover member 4 is at the uppermost position. FIG. 1 shows a state in which the cover member 4 covering the whole socket main body section 2 is at the lowermost position.

Figure 4:
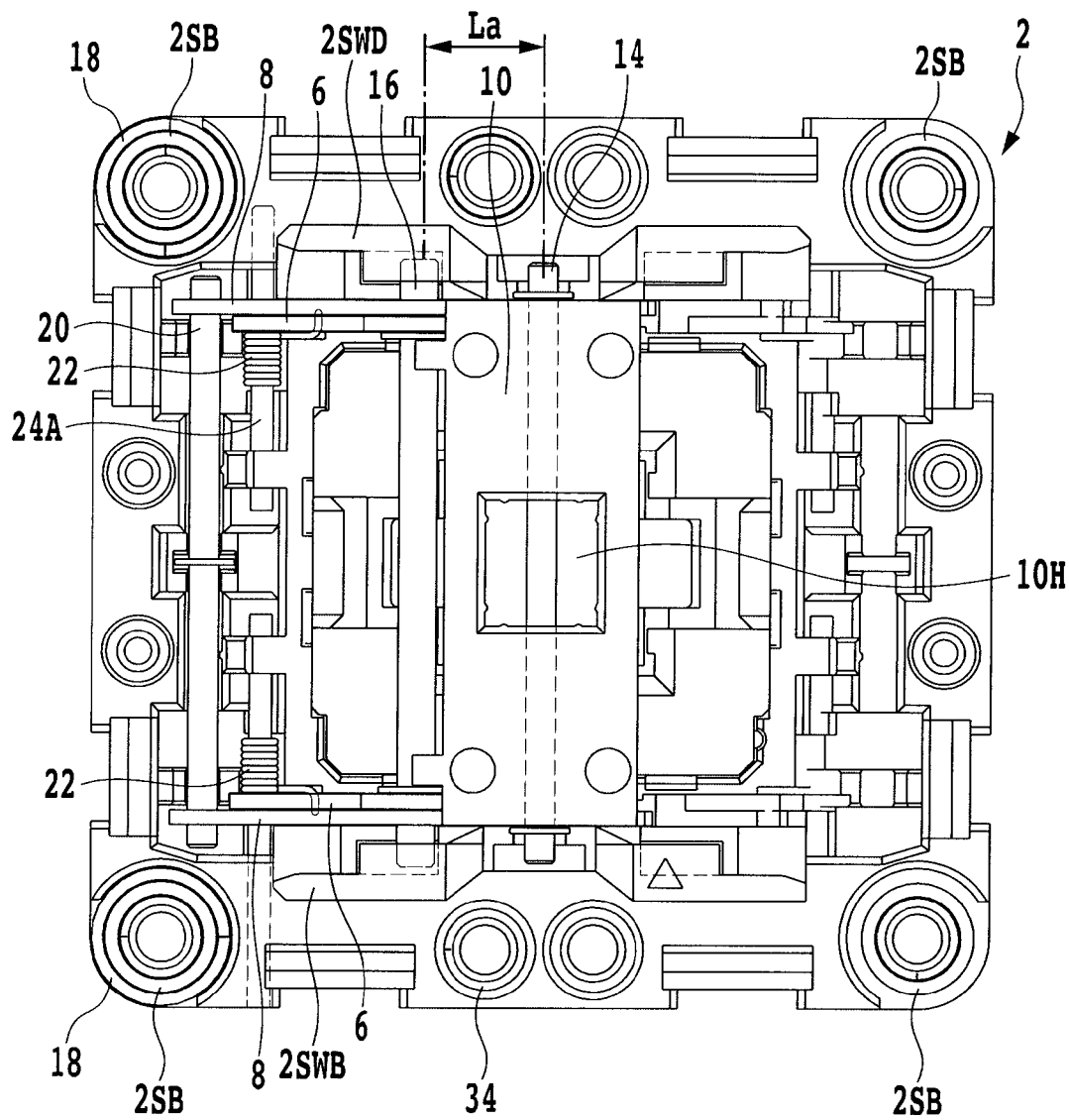
FIG. 4 is a plan view in the plan view shown in FIG. 3 with a cover member removed therefrom.

Furthermore, four coil springs 18 biasing the cover member 4 upward are provided between the inside portion of the cover member 4 and the spring receiver 2SB of the socket main body section 2 (see FIG. 4). Sub-coil springs 34 may be appropriately placed on the respective spring receivers 2SR so as to set the pressing force exerted on the loaded semiconductor device DVA to an appropriate value.

Grooves 4Sa and 4Sb with which an arm member 8 and a lever member 6 are engaged respectively, are formed around the periphery of the opening 4*a* in the cover member 4 at a predetermined distance therebetween.

Figure 2B:
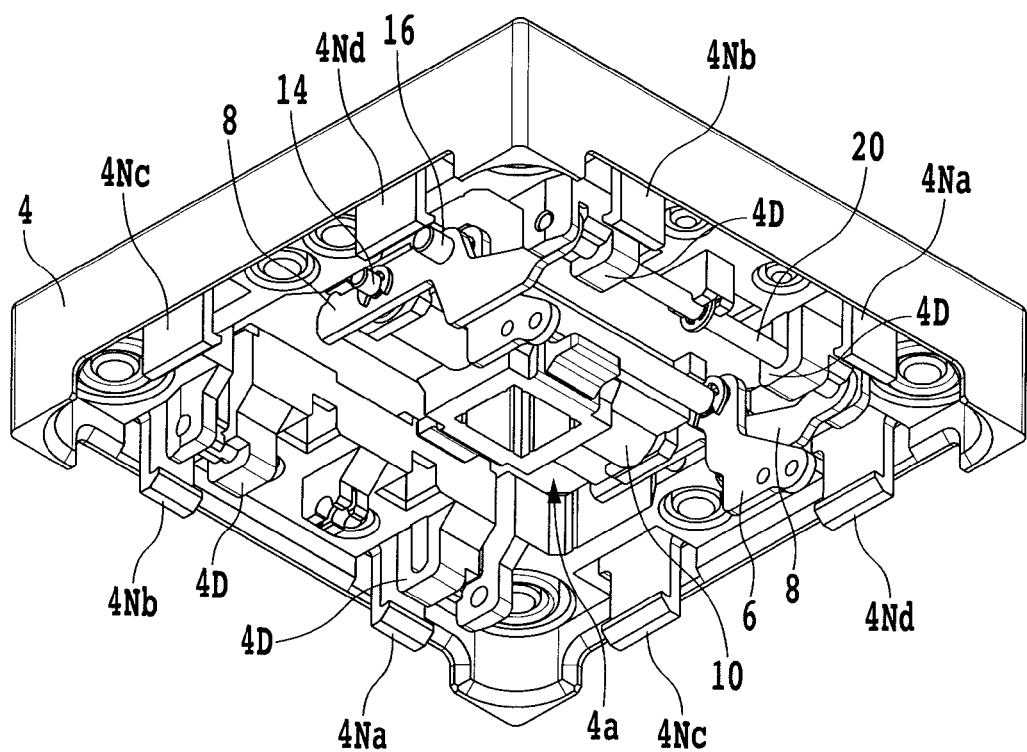
FIG. 2B is a perspective view of the semiconductor device socket in FIG. 2A with a socket main body section removed therefrom, as seen from below.
Figure 3:
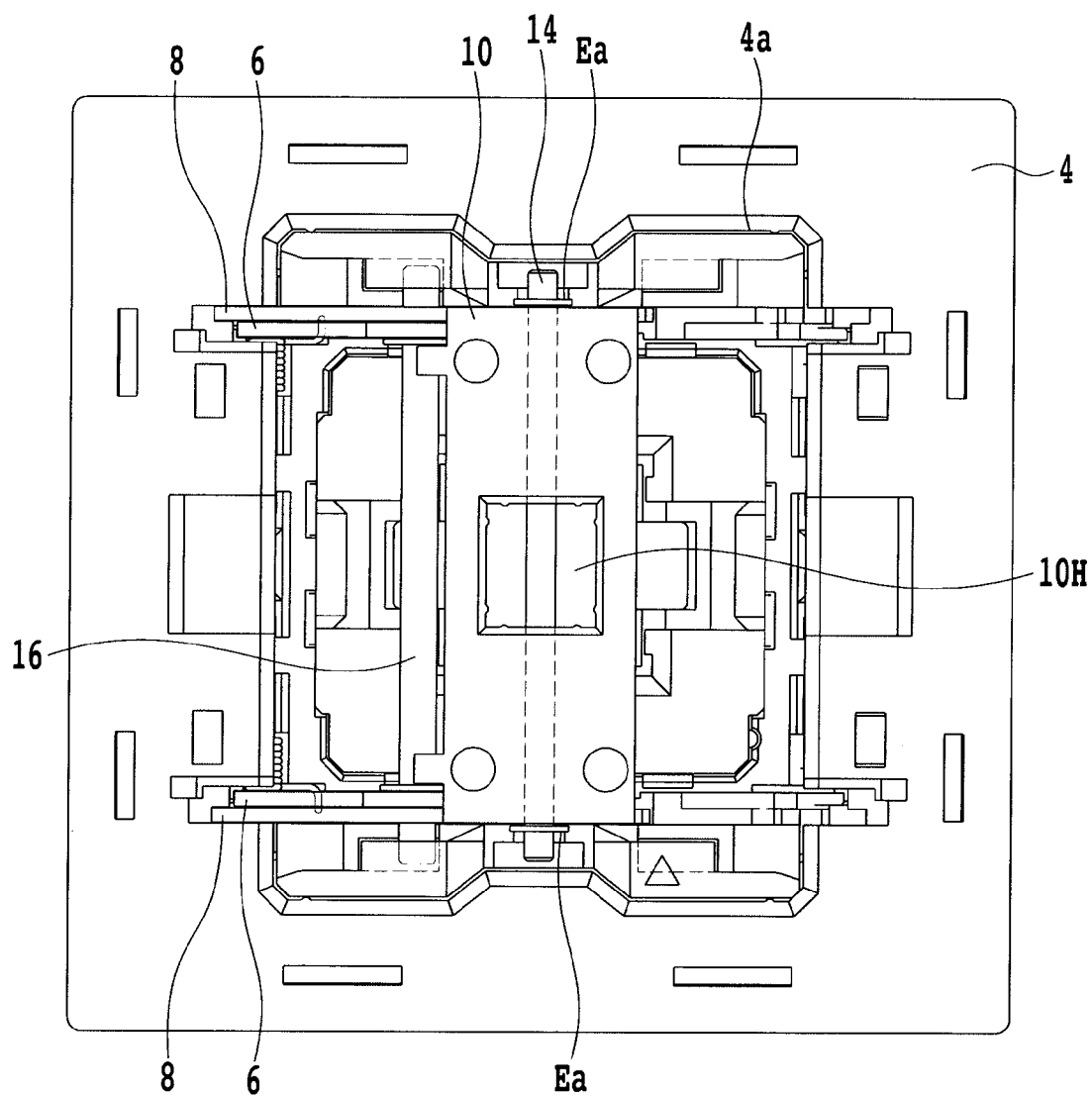
FIG. 3 is a plan view of the example shown in FIG. 2A.

As shown enlarged in FIG. 2B, arm sections 4D penetrated by the coupling pin 20 for coupling one end of one of the paired arm members 8 arranged parallel to each other are integrally formed generally parallel to each other between the groove sections 4Sa of the cover member 4 and between the groove sections 4Sb thereof. As shown in FIGS. 2B and 4, a central portion of the coupling pin 20 is coupled, by an E ring, to a fixing section 4F formed between the arm sections 4D. The one end of each arm member 8 is coupled to the respective opposite ends of the coupling pin 20.

Figure 12:
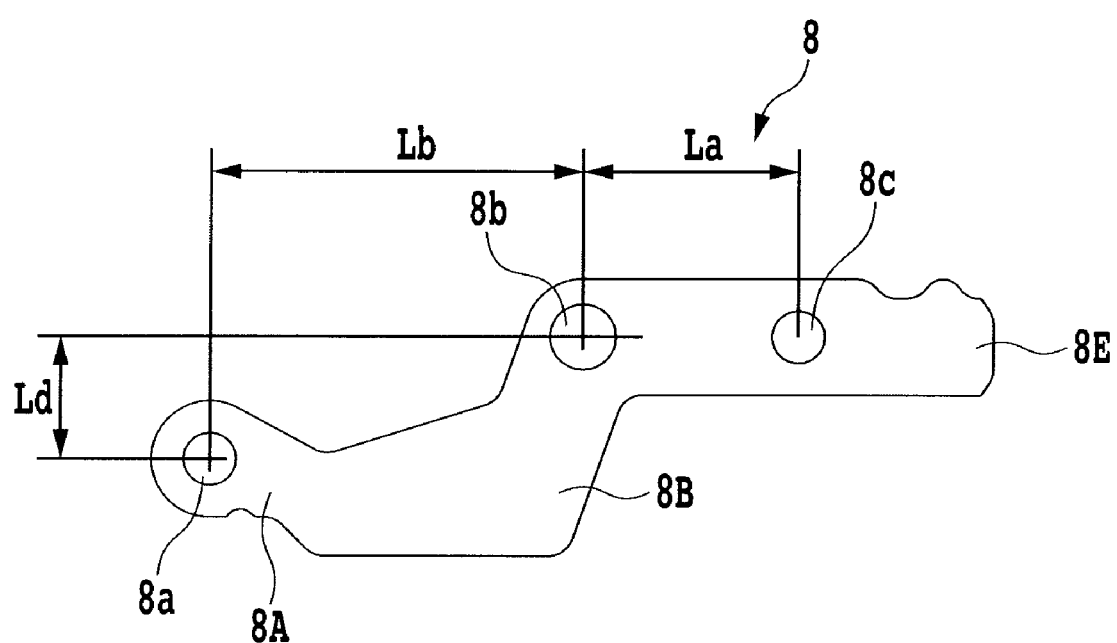
FIG. 12 is a front view of the arm member shown in FIG. 10.

As shown enlarged in FIG. 12, the arm member 8 is composed of a holding portion 8E holding the pressing member 10, a base end 8A having a hole 8*a* coupled to the one end of the coupling pin 20, and a coupling portion 8B coupling the base end 8A and the holding portion 8E together.

The holding portion 8E has holes 8*b* and 8*c* located on a common straight line at a predetermined distance La therebetween. The coupling pin 16 and a support shaft 14 both described below are inserted into the holes 8*b* and 8*c*, respectively. The distance La is set to be shorter than the corresponding distance Lb between the holes 8*a* and 8*b* in the same direction and is preferably minimized in order to increase a pressing force described below. The position of the straight line common to the holes 8*b* and 8*c* in the holding portion 8E is displaced to the top surface side of the cover member 4 with respect to the position of the hole 8*a* by the distance Ld as shown in FIGS. 7 and 12.

Figure 10:
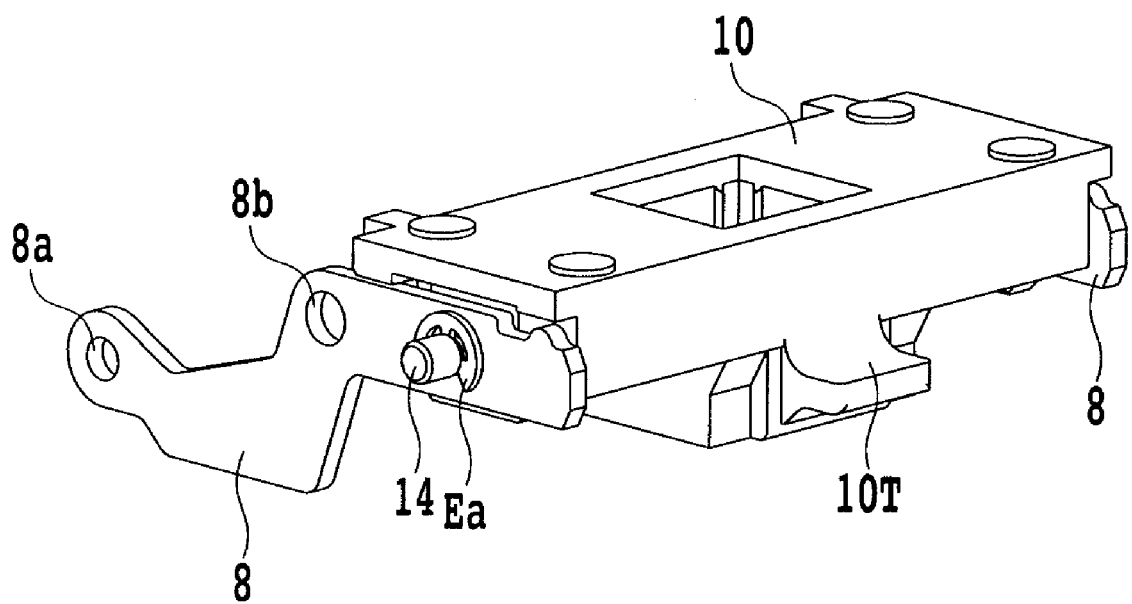
FIG. 10 is a perspective view showing a pressing member and an arm member both provided in the example shown in FIG. 2A.
Figure 11:
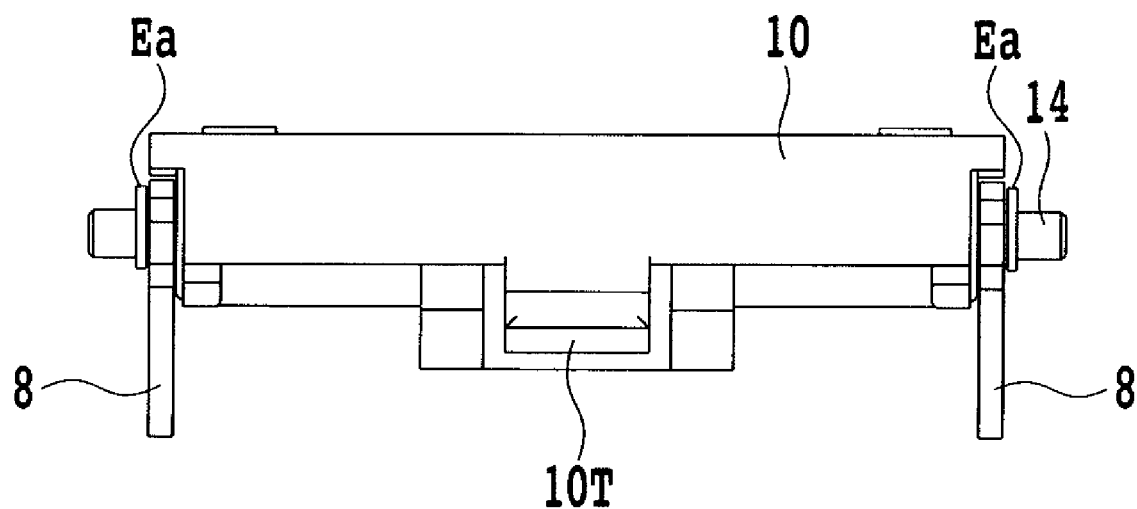
FIG. 11 is a front view of the pressing member shown in FIG. 10.

As shown in FIGS. 10 and 11, the pressing member 10 is located between the arm members 8. The opposite ends of the support shaft 14 penetrating an internal central portion of the pressing member 10 are inserted into the holes 8*c* in the arm members 8 and fixed by respective E rings Ea. Consequently, the pressing member 10 is rotationally movably supported by the holding portions 8E of the arm members 8. Thus, since when the pressing section 10P of the pressing member 10 presses the semiconductor device DVA, a pressing surface 10PS is maintained generally parallel to the top surface of the semiconductor device DVA without interfering with the semiconductor device at an edge of the pressing surface 10PS, the semiconductor device is pressed under a uniform pressure.

Figure 8:
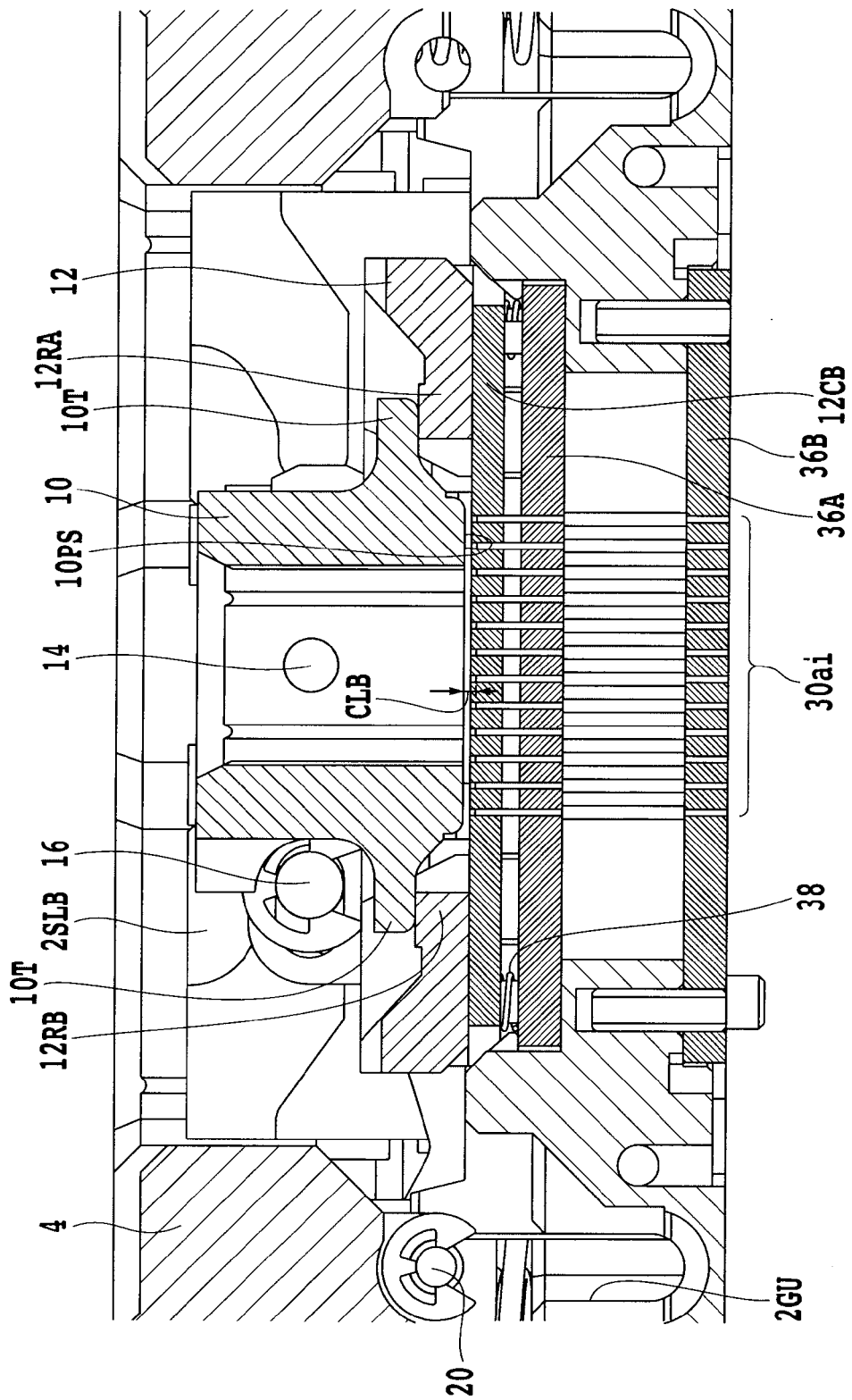
FIG. 8 is a partial sectional view of the example shown in FIG. 2A and in which semiconductor device is unloaded.

The generally rectangular parallelepiped pressing member 10 has a rectangular aperture 10H in a central portion thereof. As shown in FIG. 1, the pressing section 10P is formed around the periphery of the aperture 10H to touch to and press the top surface of the semiconductor device DVA. On an end surface of the pressing section 10P, the pressing surface 10PS is formed around the periphery of the aperture 10H. As shown enlarged in FIG. 8, an overhanging portion 10T is formed in a central portion of each long side of the pressing member 10. When the semiconductor device DVA is not placed in the semiconductor device placement section 12A, each overhanging portions 10T is received by receiving surface portions 12RA and 12RB, respectively, of the positioning member 12. Thus, since when the semiconductor device DVA is not placed in the semiconductor device placement section 12A, a gap CLB is formed between the pressing surface 10PS and the inner surface of the bottom wall section 12CB, there is little likelihood that the pressing surface 10PS and the bottom wall section 12CB interfere with each other.

Furthermore, as shown in FIG. 9, one end of each of the paired lever members 6 is coupled to the coupling pin 16 between the arm members 8. Movement of the coupling pin 16 in the axial direction is regulated by the E rings Ea each located adjacent to the corresponding lever member 6.

Figure 13:
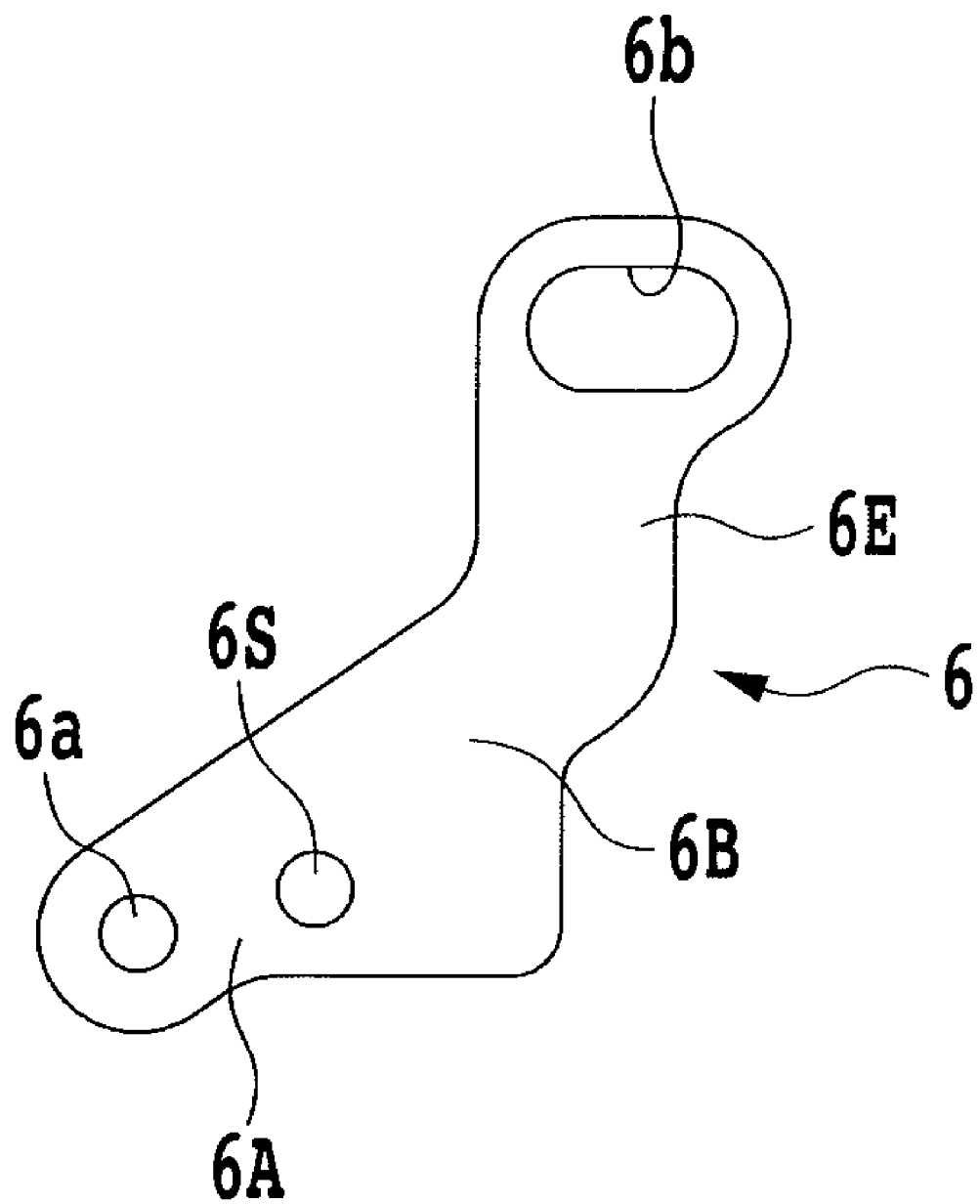
FIG. 13 is a front view showing a lever member provided in the example shown in FIG. 2A.

As shown enlarged in FIG. 13, the lever member 6 is composed of a base end section 6A having a hole 6a penetrated by the support shaft 24A, an arm section 6E having a slot 6b penetrated by the coupling portion 16, and a coupling portion 6B coupling the base end section 6A and the arm section 6E together. In FIG. 7, the slot 6b is formed to extend in a direction generally parallel to the lower flat surface portion 2SLCD corresponding to the circular arc surface portion 2ST of the holding walls 2SWB and 2SWD.

As shown in FIG. 4, a hole 6S is formed in the coupling portion 6B so that one end of a torsion coil spring 22 wound around the support shaft 24A is fixed at the edge of the hole 6S. The other end of the torsion coil spring 22 is fixed on the socket main body section 2. Thus, the lever member 6 is biased in a clockwise direction in FIG. 7, that is, in a direction in which the arm section 6E of the lever member 6 moves closer to the positioning member 12.

Figure 14A:
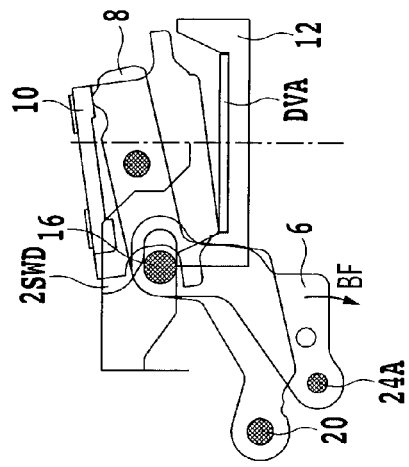
FIG. 14A to FIG. 14E are diagrams made available for explaining operations in the example shown in FIG. 2A.
Figure 14B:
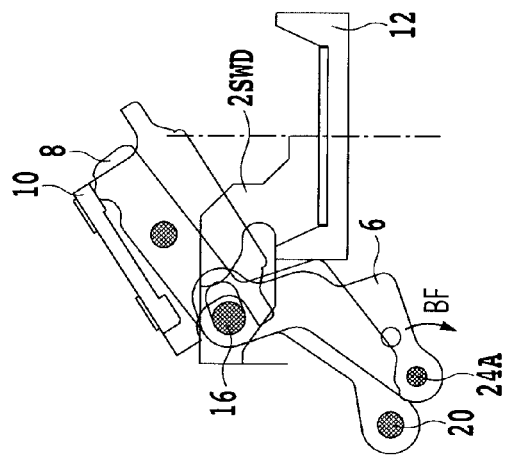

When the pressing member 10 in the state shown by a solid line in FIG. 7 separates from the semiconductor device placement section 12A of the positioning member 12 as shown by a chain double-dashed line, as shown in FIG. 14A, first, the arm member 8 starts to move rotationally in a counterclockwise direction about the coupling pin 16 as an instantaneous center between the lever member 6 and the arm member 8, with the opposite ends of the coupling pin 16 touching on the lower flat surface 2SLCD, resulting from the cover member 4 being pressed under a predetermined pressure in the direction of arrow F. At the same time, the whole arm member 8 is pulled. Then, a component force of the tensile force in the direction of arrow H allows the opposite ends of the coupling pin 16 to begin to slide in the direction of arrow H with respect to the slot 6b in the lever member 6, the circular arc surface portion 2ST of the holding wall 2SWD, the upper flat surface portion 2SLCD, and the lower flat surface portion 2SLCD as shown in FIG. 14B. At that time, since the lever member 6 is biased by the torsion coil spring 22 in the direction of arrow BF shown in FIGS. 14C and 14D, that is, in a clockwise direction, the coupling pin 16 is not in danger of moving freely in the slot 6b.

Figure 14C:
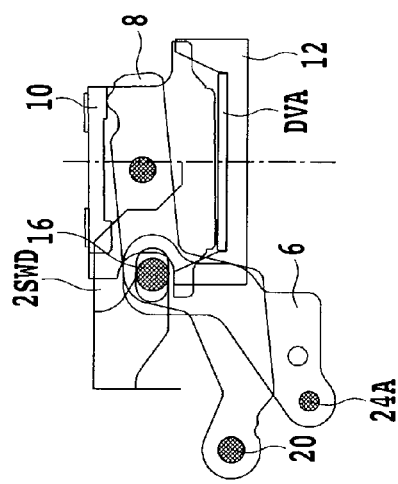
Figure 14D:
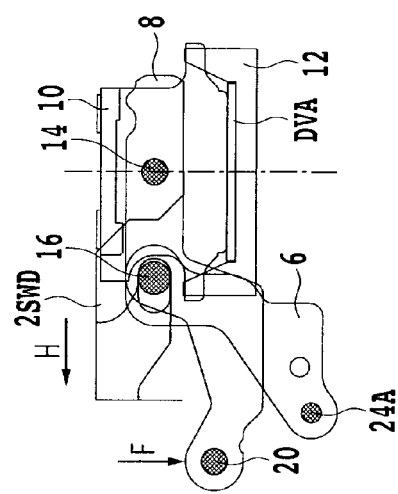
Figure 14E:

Then, when the opposite ends of the coupling pin 16 reach the other ends of the slots 6b of the lower members 6 as shown in FIG. 14C, resulting from the cover member 4 being further pressed and are then disengaged from the circular arc surface portion 2ST and come into contact with the bent surface portion 2SLA while sliding, as shown in FIG. 14D, the opposite ends of the coupling pin 16 are disengaged from the holding wall 2SWD to cause the lever member 6 to be further rotationally moved.

when the cover member 4 is further pressed to and held at the lowermost position, as shown in FIG. 14E, the coupling pin 20 is guided to the guide groove 2GU to be made to move closer to the support shaft 24A. That is, the pressing member 10 and the arm members 8 are held at standby positions thereof located as far from the positioning member 12 as possible resulting from the opposite ends of the coupling pin 16 being disengaged from the holding wall 2SWD. Hereby, upon loading/unloading of the semiconductor device DVA, the pressing member 10 is not in danger of interfering with the semiconductor device DVA.

On the other hand, in cases where the pressing member 10 in the state shown FIG. 6 is rotationally moved to the state shown in FIG. 7 to press the semiconductor device DVA placed in the semiconductor device placement section 12A of the positioning member 12, first, when the cover member 4 is released from the state in which the cover member 4 is pressed to and held at the lowermost position, the cover member 4 is moved by the bias force of the coil spring 18 in a direction in which the cover member 4 separates from the socket main body section 2. At that time, the lever members 6 are rotationally moved in a clockwise direction by the bias force of the torsion coil spring 22, with the coupling pin 16 touching on the ends of the slots 6b thereof. Hereby, as shown in FIG. 14D, the coupling pin 20 is separated from the support shaft 24A and each of the arm members 8 is rotationally moved with the coupling pin 16 touching on one end of the slot 6b of the corresponding lever member 6, so as to move closer to the holding wall 2SWD. Given that the torsion coil spring 22 is not present, in the trajectory of motion of the coupling pin 16, by the coupling pin 16 moving toward the other end side of the slot 6b, the distance between the center axis of the coupling pin 16 in the trajectory above and the support shaft 24A increases. Therefore, the coupling pin 16 may interfere and mesh with the bent surface portion 2SLA of the holding wall 2SWD. However, this situation is avoided when the torsion coil spring 22 is present as in the present embodiment. Even if the coupling pin 16 interferes with the bent surface portion 2SLA of the holding wall 2SWD, the coupling pin 16 is guided to the circular arc surface portion 2ST by the bent surface portion 2SLA.

when the cover member 4 is further moved, the whole arm members 8 and the coupling pin 16 are moved in a direction opposite to that of arrow H in FIG. 14A as shown in FIG. 14C. Hereby, as shown in FIG. 14A, the opposite ends of the coupling pin 16 are held by the circular arc surface portion 2ST of the holding wall 2SWD and the upper flat surface portion 2SLCU. Consequently, since the opposite ends of the coupling pin 16 in the arm members 8 are held by the circular arc surface portion 2ST of the holding wall 2SWD and the upper flat surface portion 2SLCU, according to the principle of leverage, the pressing surface portion 10PS of the pressing member 10 is subjected to a pressing force based on the bias force of the coil spring 18 and corresponding to the ratio of the above described distances La and Lb of the arm members 8. That is, the pressing force of the cover member 4 can be reduced. Furthermore, since the pressing member 10 can press the semiconductor device DVA ranging in externally size for example, not less than 10 mm nor more than 25 mm on a side, there is no need to lengthen the overall length of the arm member according to the size of the semiconductor device DVA in order to increase the pressing force.

Figure 15:
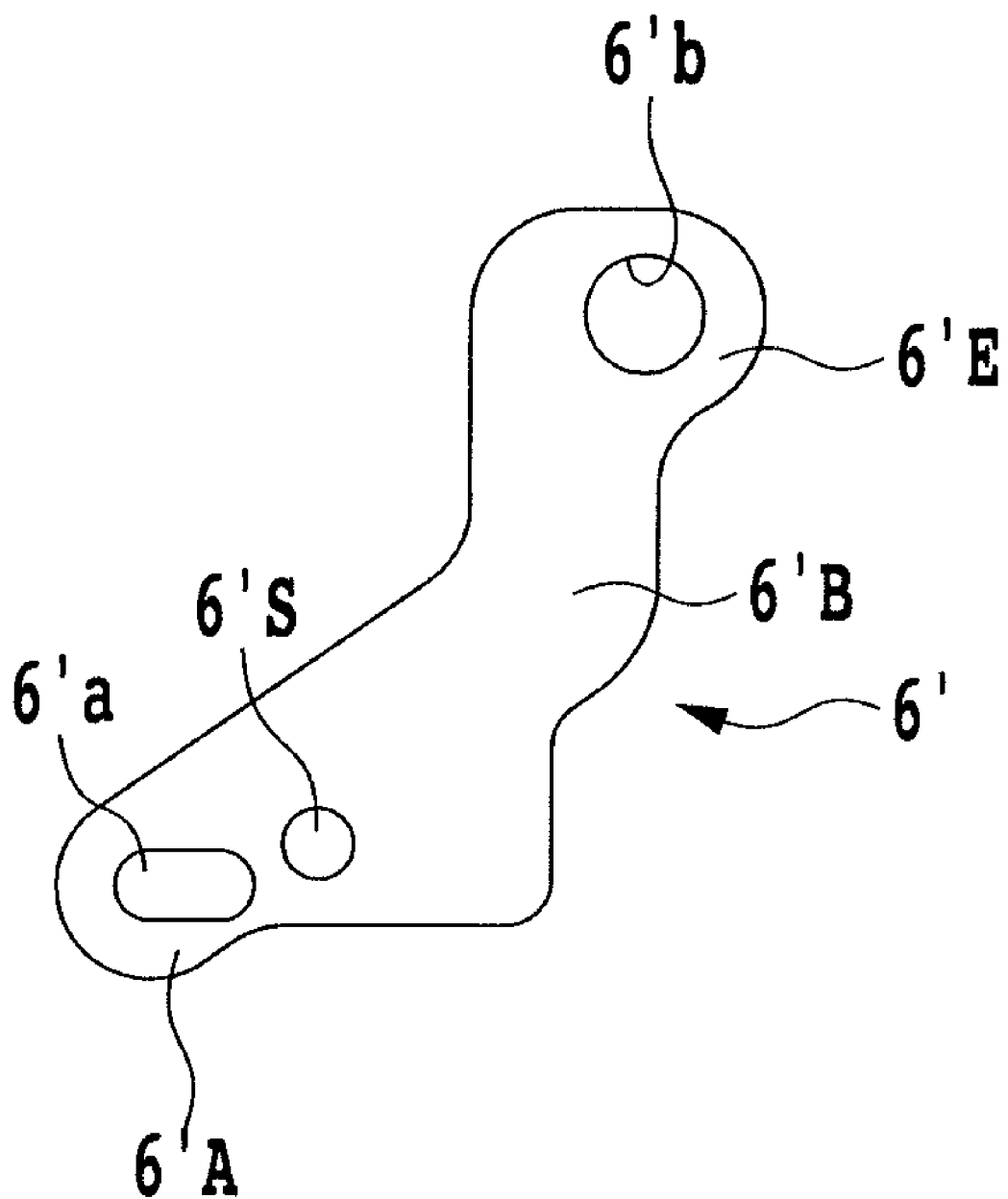
FIG. 15 is a front view showing another example of a lever member.

In the above-described example, although the lever member 6 is provided with the arm section 6E having the slot 6b, the present invention is not limited to this example. For example, as shown in FIG. 15, a lever member 6' may comprise an arm section 6'E having a circular hole 6'b and a base end section 6'A having a slot 6'a. If the socket comprises the lever member 6', the instead of the torsion coil spring 22, a torsion coil spring that is twisted in the opposite direction to the direction of the torsion coil spring 22 is provided.

In FIG. 15, the lever member 6' is composed of the base end section 6'A having the slot 6'a penetrated by the support shaft 24A, the arm section 6'E having the circular hole 6'b penetrated by the coupling pin 16, and a coupling portion 6'B coupling the base end section 6'A and the arm section 6'E together. The slot 6'a is formed to extend in a direction generally parallel to the lower flat surface portion 2SLCD in FIG. 7 corresponding to the circular arc surface portion 2ST of the holding walls 2SWB and 2SWD.

A hole 6'S is formed in the coupling portion 6'B so that one end of the torsion coil spring wound around the support shaft 24A is fixed in the hole 6'S. Thus, the lever member 6' is biased in a counterclockwise direction in FIG. 7, that is, in a direction in which the arm section 6'E of the lever member 6' separates from the positioning member 12.

In this example, when the pressing member 10 in the state shown by the solid line in FIG. 7 is separated from the semiconductor device placement section 12A of the positioning member 12 as shown by a chain double-dashed line, as shown in FIG. 16A, first, each of the arm members 8 starts to move rotationally in a counterclockwise direction about the coupling pin 16 as an instantaneous center between the corresponding lever member 6' and the arm member 8, with the opposite ends of the coupling pin 16 touching on the lower flat surface 2SLCD resulting from the cover member 4 being pressed under a predetermined pressure in the direction of arrow F. At the same time, the whole arm member 8 is pulled. Hereby, a component force of the tensile force in the direction of arrow H causes the opposite ends of the coupling pin 16 to begin to slide in the direction of arrow H with respect to the slot 6'a in the lever member 6', the circular arc surface portion 2ST of the holding wall 2SWD, the lower flat surface portion 2SLCD, and the upper flat surface portion 2SLCD as shown in FIG. 16B. At that time, since the lever member 6' is biased by the torsion coil spring in the direction of arrow BF' shown in FIGS. 16C and 16D, that is, in a counterclockwise direction, the coupling pin 16 is not in danger of moving freely in the slot 6'a.

Then, when the opposite ends of the coupling pin 16 reach the other ends of the slots 6a of the lever members 6 resulting from the cover member 4 being further pressed as shown in FIG. 16C and are disengaged from the circular arc surface portion 2ST, as shown in FIG. 16D, the opposite ends of the coupling pin 16 are disengaged from the holding wall 2SWD and the lever member 6' is further rotationally moved. When the cover member 4 is further pressed to and held at the lowermost position, as shown in FIG. 16E, the coupling pin 20 is guided through the guide groove 2GU and moved closer to the support shaft 24A. That is, the pressing member 10 and the arm members 8 are held at predetermined standby positions thereof located away from the positioning member 12.

On the other hand, in cases where the pressing member 10 in the state shown FIG. 6 is rotationally moved to the state shown in FIG. 7 to press the semiconductor device DVA placed in the semiconductor device placement section 12A of the positioning member 12, first, when the cover member 4 is released from the state in which the cover member 4 is pressed to and held at the lowermost position, the cover member 4 is moved by the bias force of the coil spring 18 in a direction in which the cover member 4 separates from the socket main body section 2. At that time, the lever members 6' are rotationally moved in a clockwise direction against the bias force of the torsion coil spring, with the coupling pin 16 touching on the ends of the slots 6'a thereof. Hereby, as shown in FIG. 16D, the coupling pin 20 is separated from the support shaft 24A. Furthermore, each of the arm members 8 is rotationally moved about the coupling pin 16 as an instantaneous center between the corresponding lever member 6 and the arm member 8, so as to move closer to the holding wall 2SWD. When the cover member 4 is further moved, as shown in FIG. 16C, the whole arm members 8 and the coupling pin 16 are moved in a direction opposite to that of arrow H in FIG. 16A. Hereby, as shown in FIG. 16A, the opposite ends of the coupling pin 16 are held by the circular arc surface portion 2ST of the holding wall 2SWD and the upper flat surface portion 2SLCU. Consequently, since the opposite ends of the coupling pin 16 in the arm members 8 are held by the circular arc surface portion 2ST of the holding wall 2SWD and the upper flat surface portion 2SLCU, according to the principle of leverage, the pressing surface portion 10PS of the pressing member 10 is subjected to a pressing force based on the bias force of the coil spring 18 and corresponding to the ratio of the above described distances La and Lb of the arm members 8. That is, the pressing force of the cover member 4 can be reduced. Furthermore, since the pressing member 10 can press the semiconductor device DVA, for example, ranging in externally size not less than 10 mm nor more than 25 mm on a side, there is no need to lengthen the overall length of the arm member according to the size of the semiconductor device DVA in order to increase the pressing force.

Figure 17:
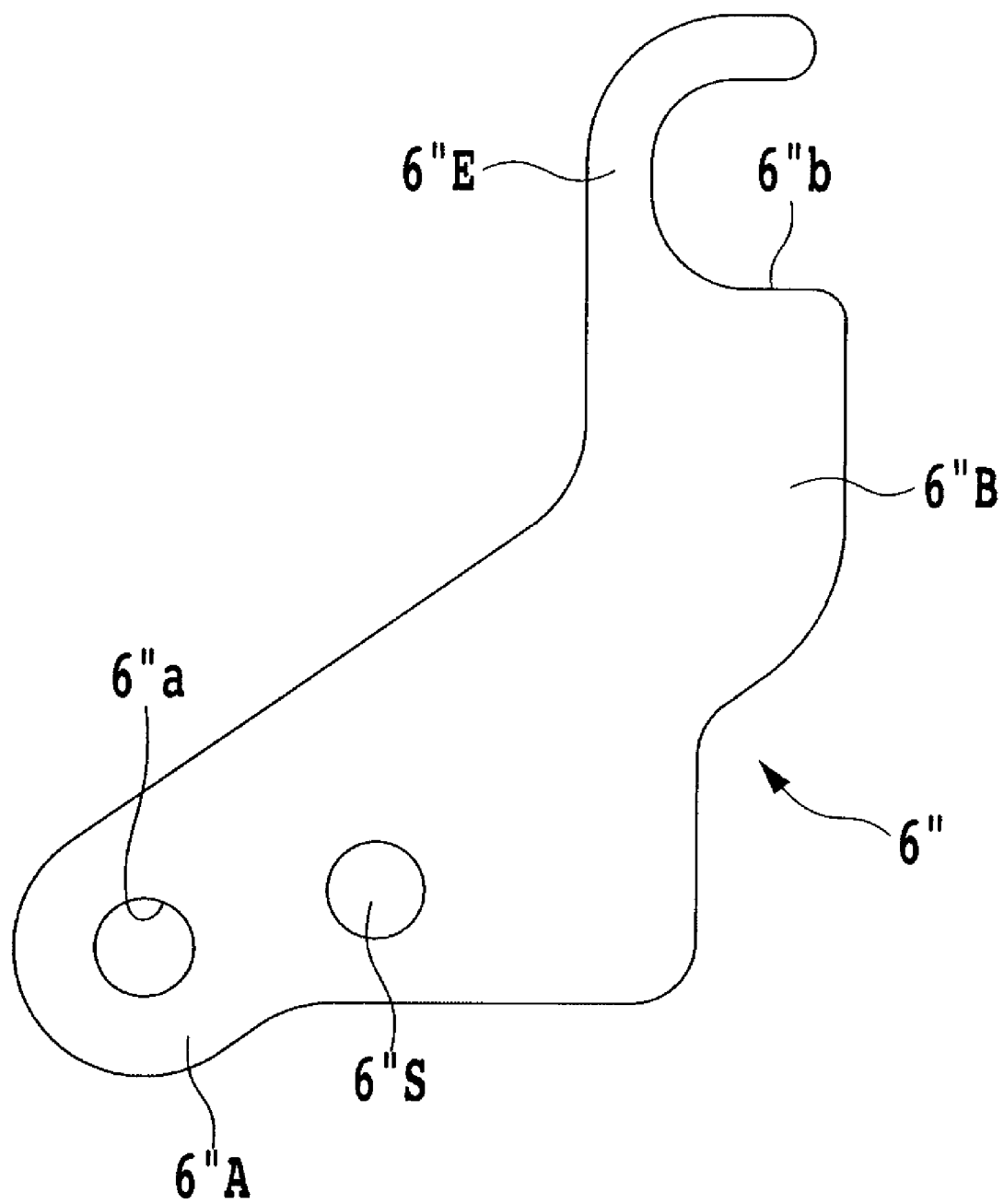
FIG. 17 is a front view showing yet another example of the lever member.

In the above-described example shown in FIG. 13, although the lever member 6 comprises the arm section 6E having the slot 6b, the present invention is not limited to this example. For example, as shown in FIG. 17, a lever member 6" may comprise an arm section 6"E having a cutout hole 6"b at one end of which is open and a base end section 6"A having a circular hole 6"a. If the socket includes the lever member 6", the torsion coil spring 22 is provided.

In FIG. 17, the lever member 6" is composed of the base end section 6"A having the slot 6"a penetrated by the support shaft 24A, the arm portion 6"E having the cutout hole 6"b penetrated by the coupling pin 16, and a coupling portion 6"B coupling the base end section 6"A and the arm portion 6"E together. The cutout hole 6"b is formed to extend in a direction generally parallel to the lower flat surface portion 2SLCD in FIG. 7 corresponding to the circular arc surface portion 2ST of the holding walls 2SWB and 2SWD.

A hole 6"S is formed in the coupling portion 6"B so that one end of the torsion coil spring wound around the support shaft 24A is fixed in the hole 6"S. Hereby, the lever member 6" is biased in a counterclockwise direction in FIG. 7, that is, in a direction in which the arm section 6"E of the lever member 6" moves closer to the positioning member 12.

Figure 18A:
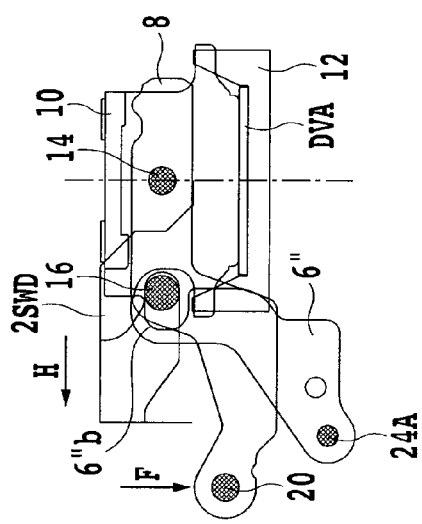
FIG. 18A to FIG. 18E are diagrams made available for explaining operations in the example shown in FIG. 2A, the operations being performed when the lever member shown in FIG. 17 is utilized.
Figure 18B:
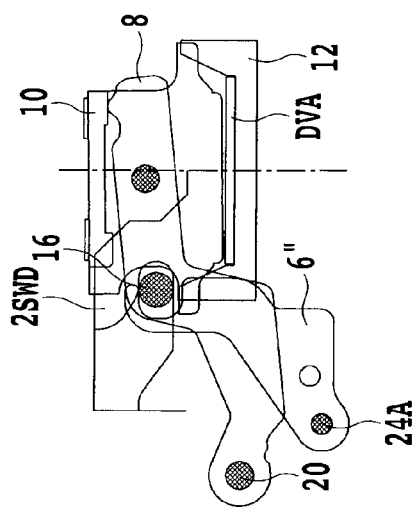

In this example, when the pressing member 10 in the state shown by the solid line in FIG. 7 is separated from the semiconductor device placement section 12A of the positioning member 12 as shown by the a chain double-dashed line, as shown in FIG. 18A, first, each of the arm members 8 starts to move rotationally in a counterclockwise direction with the opposite ends of the coupling pin 16 touching on the lower flat surface 2SLCD resulting from the cover member 4 being pressed under a predetermined pressure in the direction of arrow F. At the same time, the whole arm member 8 is pulled. A component force of the tensile force in the direction of arrow H causes the opposite ends of the coupling pin 16 to begin to slide in the direction of arrow H with respect to the cutout holes 6"b in the lever members 6" and the circular arc surface portion 2ST of the holding wall 2SWD as shown in FIG. 18B. At that time, since the lever members 6" are biased by the torsion coil springs 22 in the direction of arrow BF shown in FIGS. 18C and 18D, that is, in a counterclockwise direction, the coupling pin 16 is not in danger of moving freely in the cutout holes 6"b.

Figure 18C:
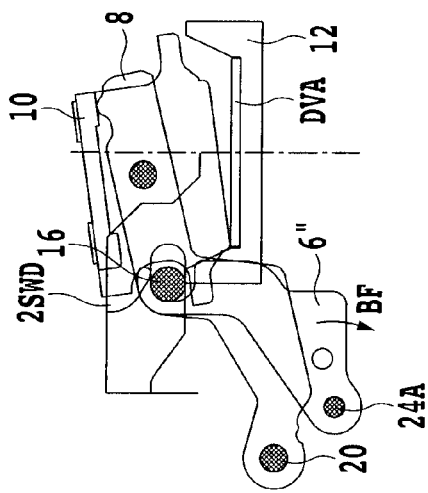
Figure 18D:
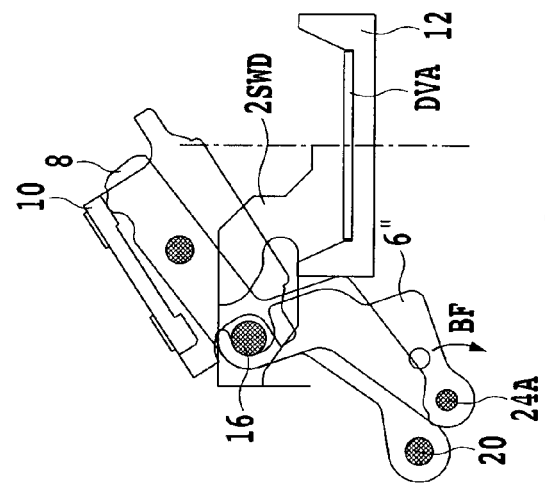
Figure 18E:
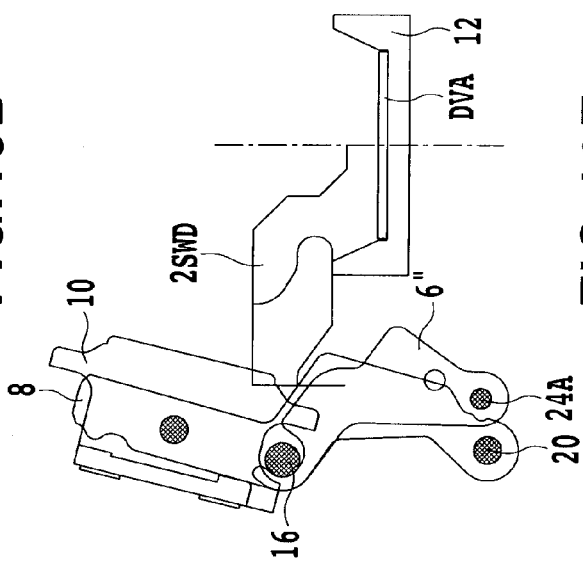

Then, the cover member 4 is further pressed to allow the opposite ends of the coupling pin 16 to reach the other ends of the cutout holes 6"b in the lever members 6" as shown in FIG. 18C. when the cover member 4 is then disengaged from the circular arc surface portion 2ST, as shown in FIG. 18D, the opposite ends of the coupling pin 16 are disengaged from the holding wall 2SWD to further rotationally move the lever members 6".

when the cover member 4 is further pressed to and held at the lowermost position, as shown in FIG. 18E, the coupling pin 20 is guided through the guide groove 2GU and moved closer to the support shaft 24A. That is, the pressing member 10 and the arm members 8 are held at predetermined standby positions thereof located as far from the positioning member 12 as possible. Hereby, during loading/unloading of the semiconductor device DVA, the pressing member 10 is not in danger of interfering with the semiconductor device DVA.

On the other hand, in cases where the pressing member 10 in the state shown FIG. 6 is rotationally moved to the state shown in FIG. 7 to press the semiconductor device DVA placed in the semiconductor device placement section 12A of the positioning member 12, first, when the cover member 4 is released from the state in which the cover member 4 is pressed to and held at the lowermost position, the cover member 4 is moved by the bias force of the coil spring 18 in a direction in which the cover member 4 separates from the socket main body section 2. At that time, the lever members 6" are rotationally moved in a clockwise direction by the bias force of the torsion coil springs 22, with the coupling pin 16 touching on the ends of the cutout holes 6"b thereof. Hereby, as shown in FIG. 18D, the coupling pin 20 is separated from the support shaft 24A. Furthermore, each of the arm members 8 is rotationally moved with the coupling pin 16 touching on one end of the cutout hole 6"b of each of the lever members 6", so as to move closer to the holding wall 2SWD. Given that the torsion coil springs 22 are not present, in the trajectory of motion of the coupling pin 16, the distance between the center axis of the coupling pin 16 and the support shaft 24A in the trajectory of motion above increases through moving of the coupling pin 16 toward the other end of each of the cutout hole 6"b. Therefore, the coupling pin 16 may interfere with the bent surface portion 2SLA of the holding wall 2SWD. However, this situation is avoided when the torsion coil springs 22 are present as in the present embodiment.

When the cover member 4 is further moved, as shown in FIG. 18C, the whole arm members 8 and the coupling pin 16 are moved in a direction opposite to that of arrow H in FIG. 18A. Hereby, as shown in FIG. 18A, the opposite ends of the coupling pin 16 are held by the circular arc surface portion 2ST of the holding wall 2SWD and the upper flat surface portion 2SLCU. Consequently, the opposite ends of the coupling pin 16 in the arm members 8 are held by the circular arc surface portion 2ST of the holding wall 2SWD and the upper flat surface portion 2SLCU. Thus, since the opposite ends of the coupling pin 16 in the arm members 8 are held by the circular arc surface portion 2ST of the holding wall 2SWD, according to the principle of leverage, the pressing surface portion 10PS of the pressing member 10 is subjected to a pressing force based on the bias force of the coil spring 18 and corresponding to the ratio of the above described distances La and Lb of the arm members 8. That is, the pressing force of the cover member 4 can be reduced. Furthermore, the pressing member 10 can press the semiconductor device DVA, for example, ranging in externally size not less than 10 mm nor more than 25 mm on a side. Thus, there is no need to lengthen the overall length of the arm member according to the size of the semiconductor device DVA in order to increase the pressing force.

In the above-described example, although each of the holding walls 2SWD and 2SWB is formed integrally with the socket main body section 2, the present invention is not limited to this example. For example, as shown in FIG. 5B, holding walls 2'SWD and 2'SWB may be formed separately from a socket main body section 2' and arranged so as to be removable from the socket main body section 2'.

Figure 5B:
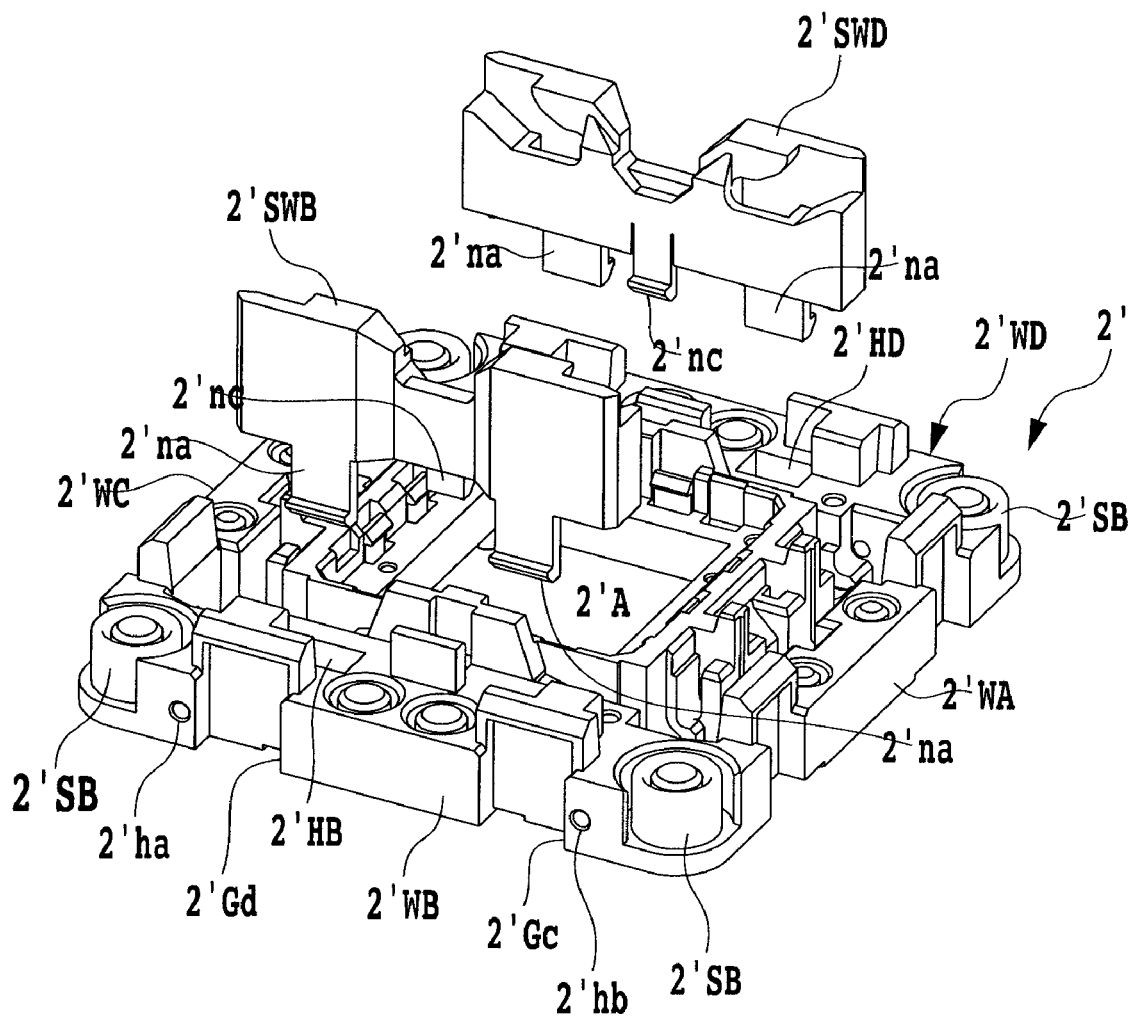
FIG. 5B is a perspective view showing a variation of the socket main body section.

In FIG. 5B the socket main body section 2' has outer shell walls 2'WA, 2'WB, 2'WC, and 2'WD around the periphery of a recess portion 2'A. The configurations of the outer shell walls 2'WA, 2'WB, 2'WC, and 2'WD are the same as those of the outer shell walls 2WA, 2WB, 2WC, and 2WD, respectively, of the above-described socket main body section 2.

Holes 2'ha and 2'hb are formed adjacent to guide grooves 2'Gd and 2'Gc so that support shafts 24A and 24B are inserted into the holes 2'ha and 2'hb, respectively.

Spring receivers 2'SB are each integrally formed in a corresponding one of corner potions coupling the outer shell walls together to receive one end of the coil spring 18. Paired spring receivers are formed between the guide grooves in each of the outer shell walls 2'WA, 2'WB, 2'WC, and 2'WD to receive one end of each sub-coil spring 34 described below. Furthermore, recess portions 2'HB and 2'HD are formed between the outer wall 2'WB and the recess portion 2'A and between the outer wall 2'WD and the recess portion 2'A, respectively. Paired nib portions 2'na and a nib portion 2'nc on the holding walls 2'SWB are fixed in the recess portions 2'HB. Paired nib portions 2'na and 2'nc on the holding walls 2'SWD are fixed in the recess portions 2'HD.

The holding walls 2'SWB and 2'SWD are symmetrically formed opposite each other across the recess portion 2'A. The structure of engagement grooves in the holding walls 2'SWB and 2'SWD is the same as that of the engagement grooves in the above-described holding wall 2SWD.

Figure 24:
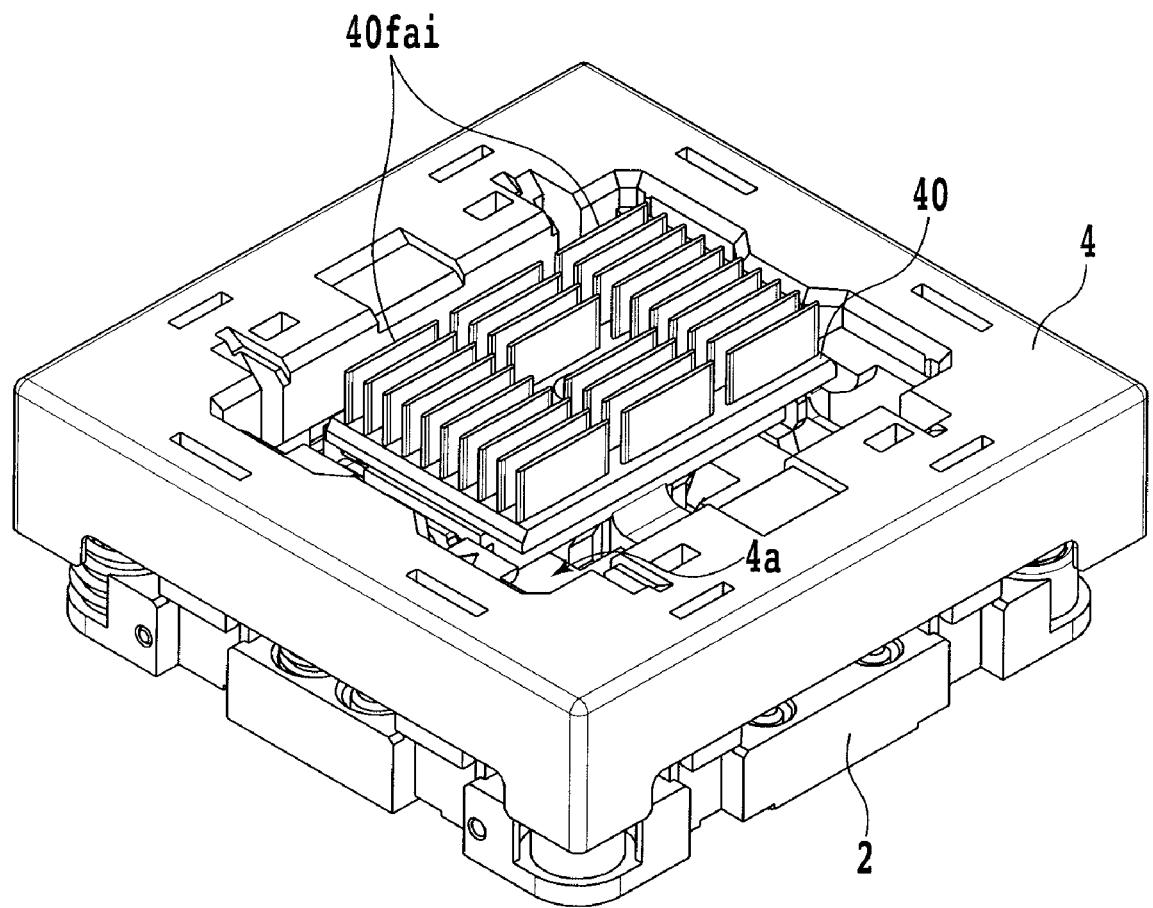
FIG. 24 is a perspective view showing the appearance of a second embodiment of the semiconductor device socket according to the present invention.
Figure 25:
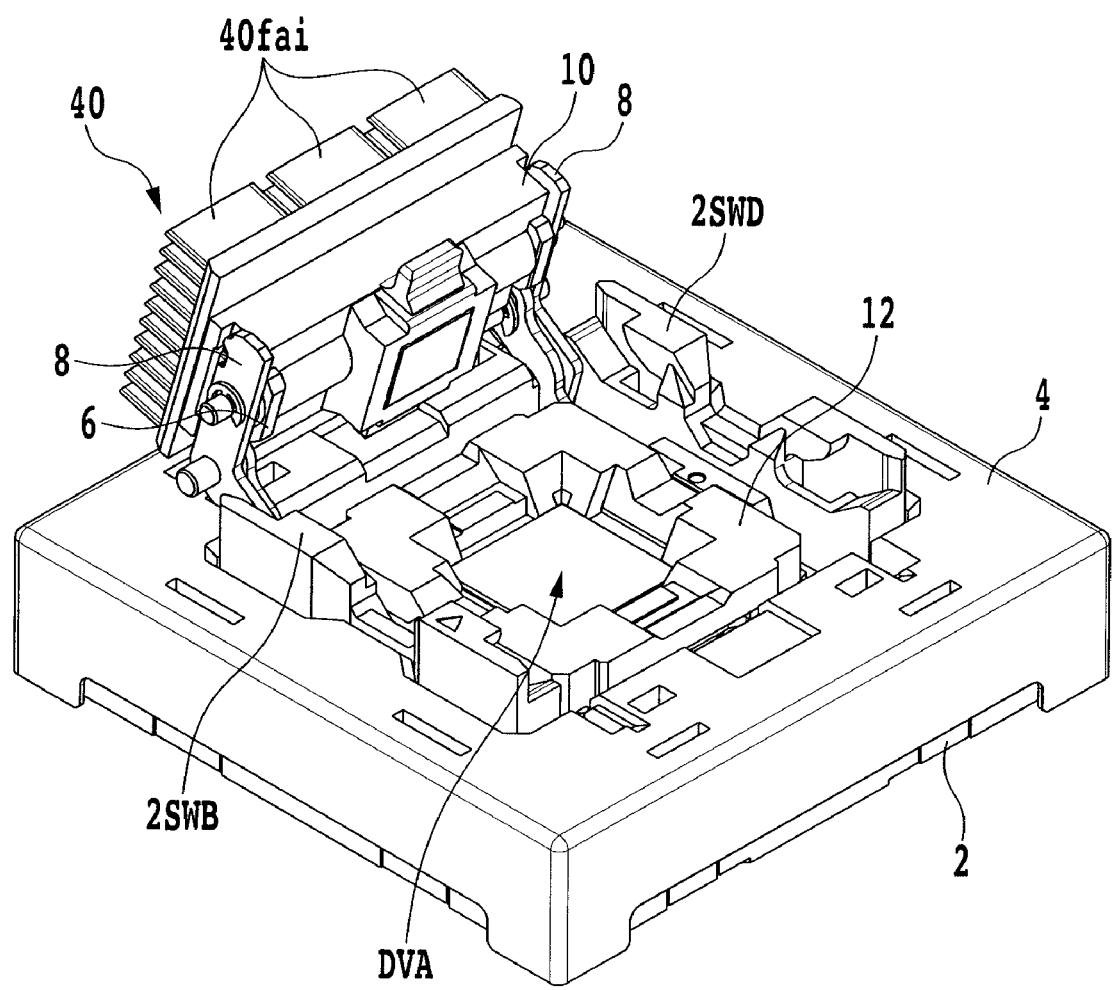
FIG. 25 is a perspective view showing the appearance of the second embodiment of the semiconductor device socket according to the present invention.

FIGS. 24 and 25 show the appearance of a second embodiment of the semiconductor device socket according to the present invention.

In FIGS. 24 and 25, a heat sink 40 is provided on the top surface of the above-described pressing member 10. In FIGS. 24 and 25, the same components as those in the example shown in FIG. 1 are denoted by the same reference numerals. Duplicate descriptions of these components are omitted.

The heat sink 40 radiates heat which generated by the semiconductor device DVA and transmitted via the pressing member 10. The heat sink 40 has a plurality of radiation fins 40$fai$ (i=1 to n; n is a positive integer) arranged at predetermined intervals. Furthermore, the heat sink 40 is positioned in a central portion of an opening 4a in a cover member 4.

Figure 19:
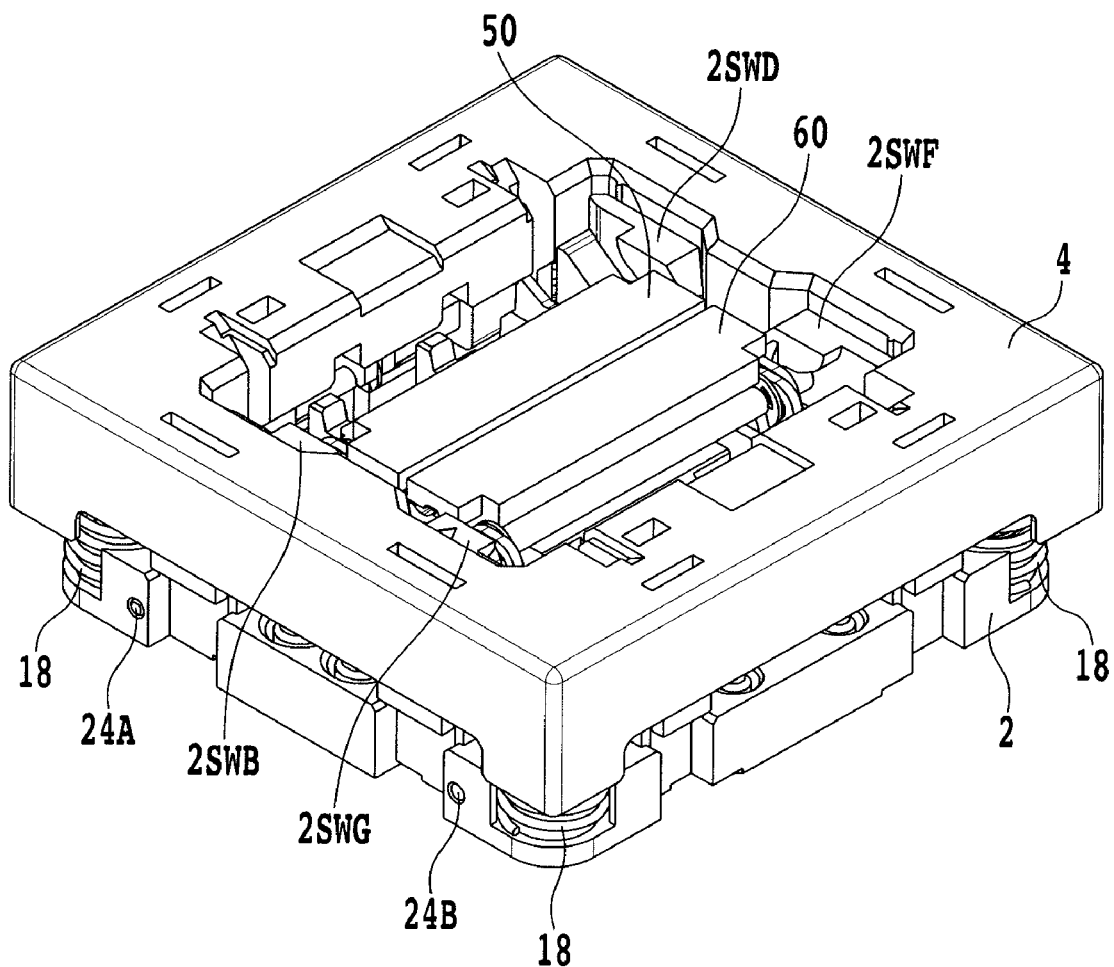
FIG. 19 is a perspective view showing the appearance of a third embodiment of the semiconductor device socket according to the present invention.
Figure 20:
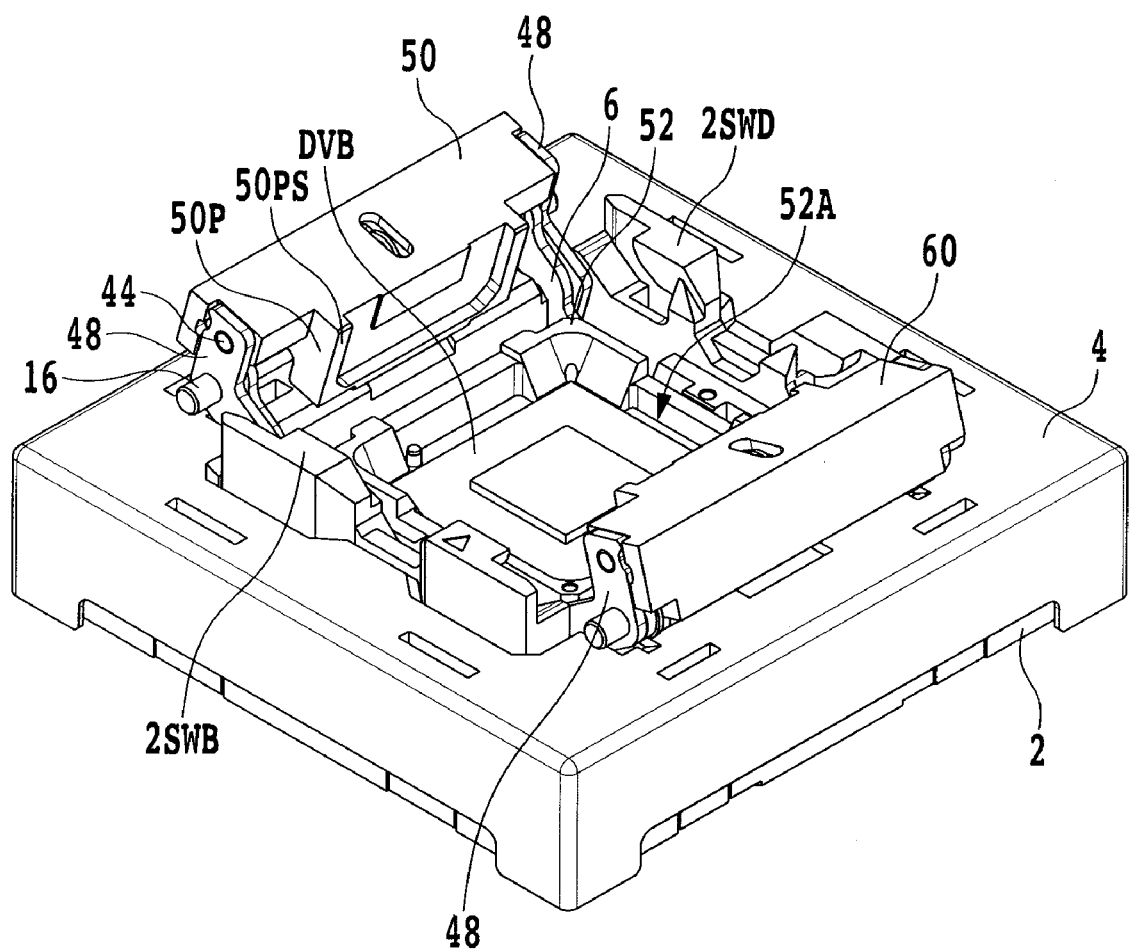
FIG. 20 is a perspective view showing the appearance of the third embodiment of the semiconductor device socket according to the present invention.

FIGS. 19 and 20 show the appearance of a third embodiment of the semiconductor device socket according to the present invention.

In the example shown in FIGS. 19 and 20, a semiconductor device DVB is loaded which has a size different from that of the above-described semiconductor device DVA. The external size of the semiconductor device DVB is larger than that of the semiconductor device DVA. Furthermore, the appropriate pressure that acts on the semiconductor device DVB is higher than that on the semiconductor device DVA. Moreover, pressing members 50 and 60 for cooperatively pressing the semiconductor device DVB are provided opposite each other.

In FIGS. 19 and 20, the same components as those in the example shown in FIG. 1 are denoted by the same reference numerals. Duplicate descriptions of these components are omitted.

The semiconductor device socket includes a positioning member 52 having an accommodation section removably accommodating the semiconductor device DVB, a socket main body section 2 having a recess portion 2A in which the positioning member 52 is removably mounted, a cover member 4 capable of raising and lowering with respect to the socket main body section 2, a plurality of contact terminals 30ai (i=1 to n, n is a positive integer) (see FIG. 21) electrically connecting terminal sections of the semiconductor device DVB placed in the accommodation section of the positioning member 52, to electrode sections of a printed wiring board PB, and a pressing and holding mechanism comprising the pressing members 50 and 60 for cooperatively pressing the terminal sections of the semiconductor device DVB against the plurality of contact terminals 30ai under a predetermined pressure.

The positioning member 52 has a generally square semiconductor device placement section 52A located in a central portion thereof and in which the semiconductor device DVB is placed in a detachable manner. Guide walls are formed in the four corners of a wall section forming the semiconductor device placement section 52A. The guide walls guide and engage with the respective corners of the semiconductor device DVB. A pair of elastically deformable nib portions of the positioning member 52 are fixed on respective paired opposite protrusion sections (not shown) provided on an inner wall section forming the recess portion 2A of the socket main body section 2. Thus, the positioning member 52 is held in the recess portion 2A so as to be able to raise and lower. The paired opposite nib portions are also formed on the other opposite sides of the positioning member 52. Hereby, by removing the nib portions from the protrusion sections against the elastic force of the nib portions in itself, the positioning member 52 can be disengaged from the recess portion 2A of the socket main body section 2.

Figure 21:
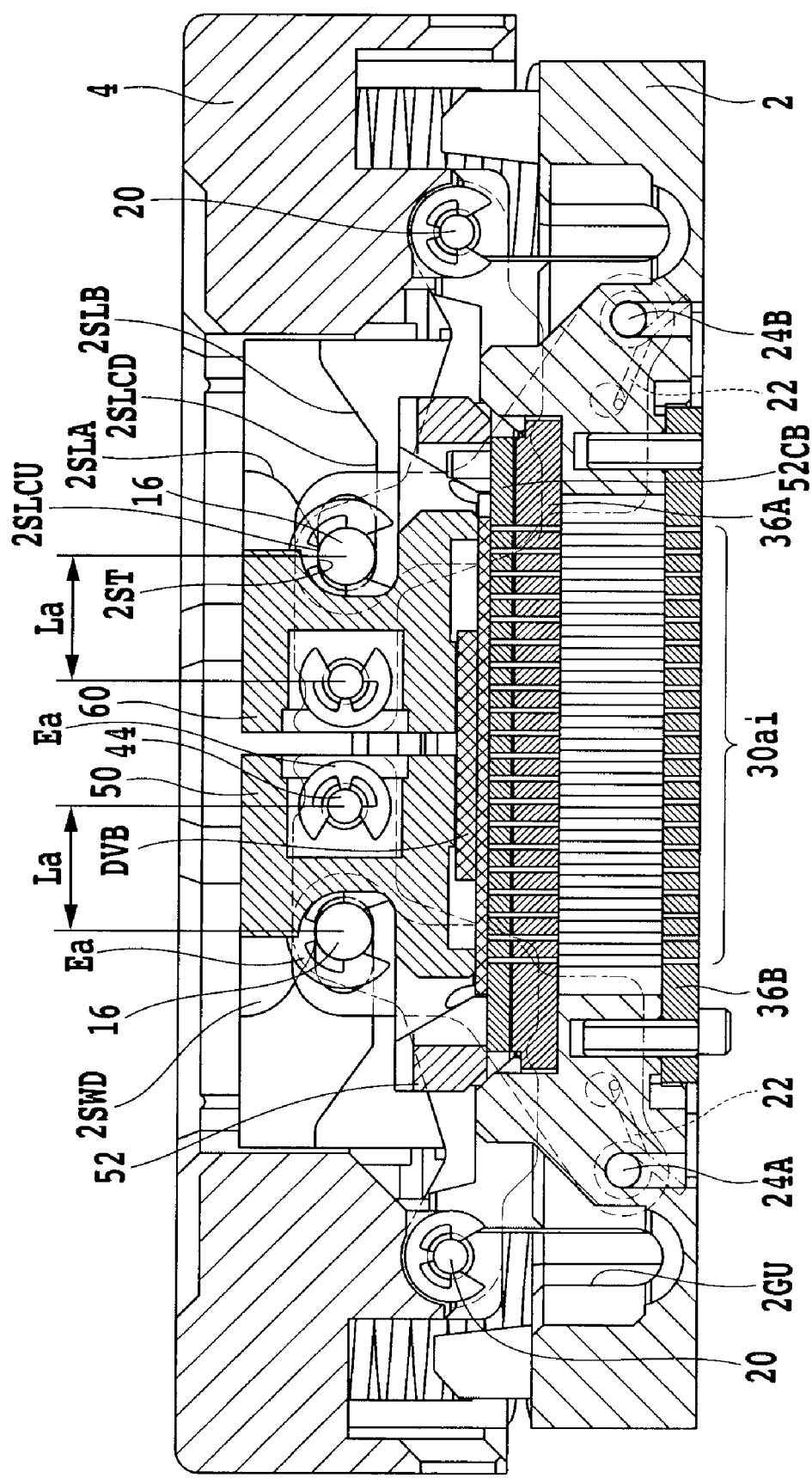
FIG. 21 is a sectional view of the example shown in FIG. 19.
Figure 22:
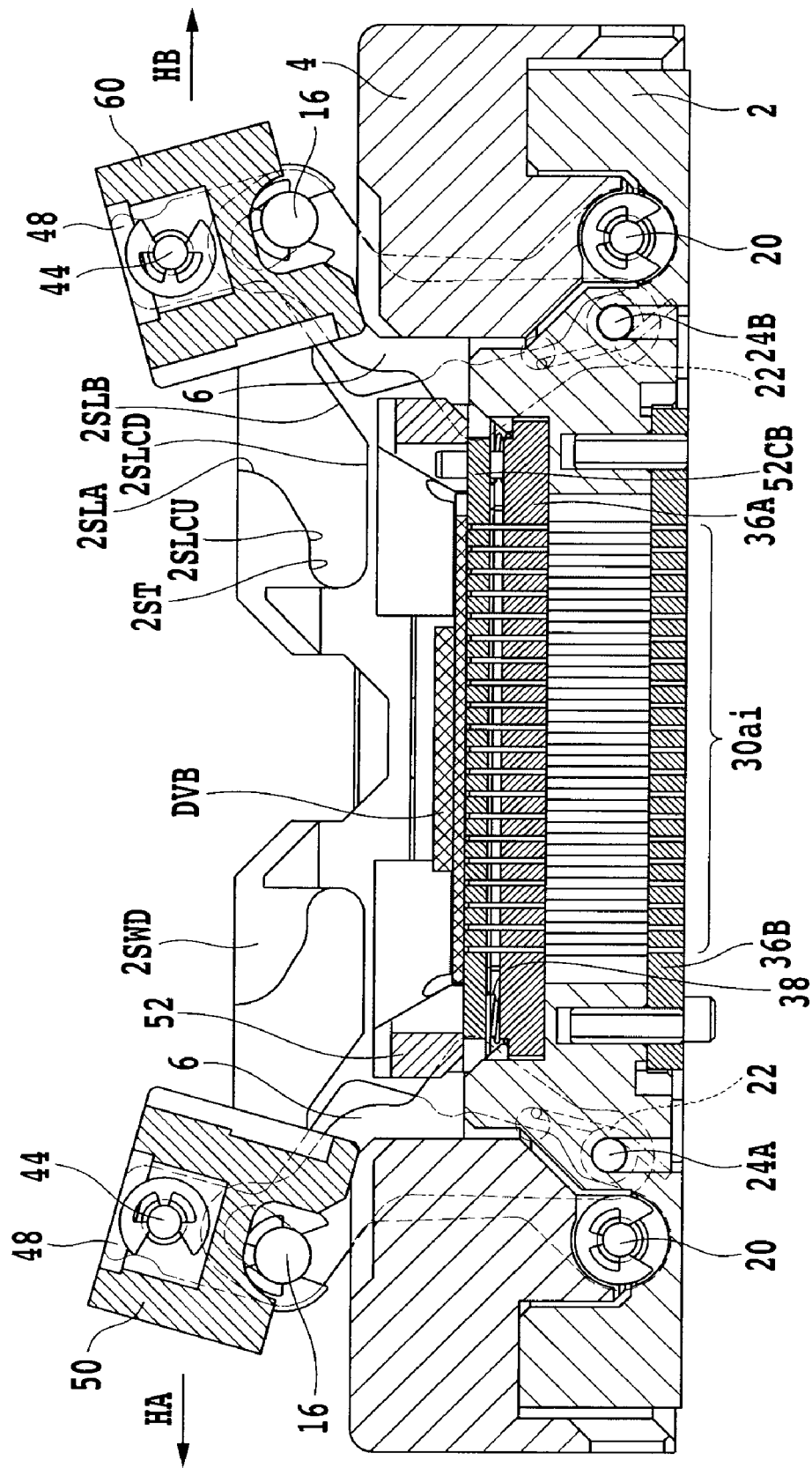
FIG. 22 is a sectional view of the example shown in FIG. 20.

In a bottom wall section 52CB forming a bottom portion of the semiconductor device placement section 52A of the positioning member 52, pores are formed in a matrix corresponding to the arrangement of the contact terminals 30ai as shown in FIGS. 21 and 22; one end of each of the contact terminals 30ai is movably inserted into the corresponding one of the pores. Furthermore, four coil springs 38 are arranged between a bottom wall section 52CB and a terminal support substrate 36A so as to be wound around respective shafts provided in the corresponding corners of the bottom wall section 52CB. The biased positioning member 52 is held at the uppermost position shown in FIGS. 19 and 21 with the nib portions fixed on the projection portions of the socket main body 2, described above.

That is, when the semiconductor device DVB placed in the semiconductor device placement section 52A is not pressed as shown in FIG. 22, the bottom wall section 52CB keeps away from the terminal support substrate 36A. Thus, one end of each of the contact terminals 30ai is prevented from projecting from the corresponding slot in the bottom wall section 52CB. On the other hand, when the semiconductor device DVB placed in the semiconductor device placement section 52A is pressed as shown in FIG. 21, the bottom wall section 52CB is placed in proximity to the terminal support substrate 36A. Hereby, the one end of each of the contact terminals 30ai in the pore of the bottom wall section 52CB is projected from it and touches on the terminal of the semiconductor device DVB.

The holding walls 2SWB and 2SWD are symmetrically formed opposite each other across the recess portion 2A.

As shown in FIG. 21, the holding wall 2SWD has paired engagement grooves in which a coupling pin 16 is held. In the example shown in FIG. 21, both engagement grooves are utilized.

An arm member 48 is composed of a holding portion for holding the pressing member 50 or 60, a base end having a hole connected to one end of a coupling pin 20, and a coupling portion for coupling the base end and the holding portion together.

The holding portion has holes located on a common straight line at a predetermined distance La (see FIG. 21) therebetween. The coupling pin 16 and a support shaft 44 are inserted into the respective holes as above. The distance La is set to be shorter than the corresponding distance, in the same direction, between the hole into which the coupling pin 20 is inserted and the hole into which the coupling pin 16 is inserted. The distance La is preferably minimized in order to increase a pressing force described below. The position of the straight line common as above in the holding portion is displaced, in FIGS. 7 and 12, toward the top surface side of the cover member 4, by a predetermined distance, from the position of the hole into which the coupling pin 20 is inserted.

As shown in FIG. 20, the pressing member 50 or 60 is located between the arm members 48 on the respective sides. Since the structure of pressing members 50 and 60 have the same structure except for the shape of a pressing surface, the pressing member 50 will be described, with the description of the pressing member 60 omitted.

The opposite ends of the support shaft 44 penetrating the interior of the pressing member 50 are inserted into the holes in the arm members 48 and fixed by respective E rings Ea. Consequently, the pressing member 50 is rotationally movably supported by the holding portions of the arm members 48.

The generally rectangular parallelepiped pressing member 50 has a pressing section 50P located in a central portion thereof and touching to and pressing the top surface of the semiconductor device DVB. A pressing surface 50PS is formed on an end surface of the pressing section 50P.

As shown in FIG. 20, one end of each of paired lever members 6 is coupled to the coupling pin 16 between the arm members 48. Movement of the coupling pin 16 in the axial direction is regulated by the E rings Ea each located adjacent to the corresponding lever member 6.

When the pressing members 50 and 60 in the state shown in FIG. 21 is separated from the semiconductor device placement section 52A of the positioning member 52 as shown in FIG. 22, first, each of the arm members 48 starts to move rotationally in a counterclockwise direction (the left arm member 48 in FIG. 21) or in a clockwise direction (the right arm member 48 in FIG. 21) in FIG. 21 about the coupling pin 16 as the center of rotation resulting from the cover member 4 being pressed under a predetermined pressure. At the same time, the whole arm member 48 is pulled. Then, a component force of the tensile force acts in the direction of arrow HA or HB to allow the opposite ends of the coupling pin 16 to begin to slide in the direction of arrow HA or HB with respect to slots 6b in the lever members 6 and the circular arc surface portion 2ST of the holding wall 2SWD (2SWB, 2SWF, 2SWG) as shown in FIG. 22. At that time, since each lever member 6 is biased in a clockwise direction or in a counter-clockwise direction in FIG. 22 by torsion coil springs 22, the coupling pin 16 is not in danger of moving freely in the slots 6b.

Then, when the cover member 4 is further pressed, resulting in the opposite ends of the coupling pin 16 reaching the other ends of the slots 6b in the lever members 6 and then disengaged from the circular arc surface portion 2ST and coming into contact with a bent surface portion 2SLA while sliding, the opposite ends of the coupling pin 16 are disengaged from the holding wall 2SWD (2SWB, 2SWF, 2SWG) to further rotationally move the lever members 6. And then, when the cover member 4 is further pressed to and held at the lowermost position, the coupling pin 20 is guided through a guide groove 2GU and is moved closer to support shaft 24A and 24B. That is, the pressing member 50 and 60 and the arm members 48 are held at predetermined standby positions thereof located away from the positioning member 52.

On the other hand, in case that the pressing members 50 and 60 in the state shown FIG. 22 is rotationally moved to the state shown in FIG. 21 to press the semiconductor device DVB placed in the semiconductor device placement section 52A of the positioning member 52, first, when the cover member 4 is released from the state in which the cover member 4 is pressed to and held at the lowermost position, the cover member 4 is moved by the bias force of the coil spring 18 in a direction in which the cover member 4 separates from a socket main body section 2. At that time, each lever member 6 is rotationally moved in a clockwise direction or in a counterclockwise direction by the bias force of the torsion coil springs 22, with the coupling pin 16 touching on the ends of the slots 6b thereof. Thus, the coupling pin 20 is separated from the support shafts 24A and 24B. Furthermore, each of the arm members 48 is rotationally moved around the coupling pin 16 so as to move closer to the holding wall 2SWD (2SWB, 2SWF, 2SWG). When the cover member 4 is further moved, after the opposite ends of the coupling pin 16 are moved toward the bent surface portion 2SLA of the holding wall 2SWD (2SWB, 2SWF, 2SWG), the whole arm members 48 and the coupling pin 16 are then moved. Hereby, the opposite ends of the coupling pin 16 are held by a circular arc surface portion 2ST of the holding wall 2SWD and an upper flat surface portion 2SLCU. Consequently, the opposite ends of the coupling pin 16 at the arm members 48 are held by the circular arc surface portion 2ST of the holding wall 2SWD and the upper flat surface portion 2SLCU. Thus, according to the principle of leverage, pressing surface portions SOPS and 60PS of the pressing members 50 and 60 are subjected to a pressing force based on the bias force of the coil spring 18 and corresponding to the above-described lever ratio of the arm members 48. That is, the pressing force of the cover member 4 can be reduced.

In the above-described third embodiment, each of the pressing members may include a heat sink as in the case of the second embodiment. Furthermore, the pressing member may include lever members 6' as shown in FIG. 15, and torsion coil springs twisted in the direction opposite to that in which the torsion coil springs 22 are twisted.

Figure 23:
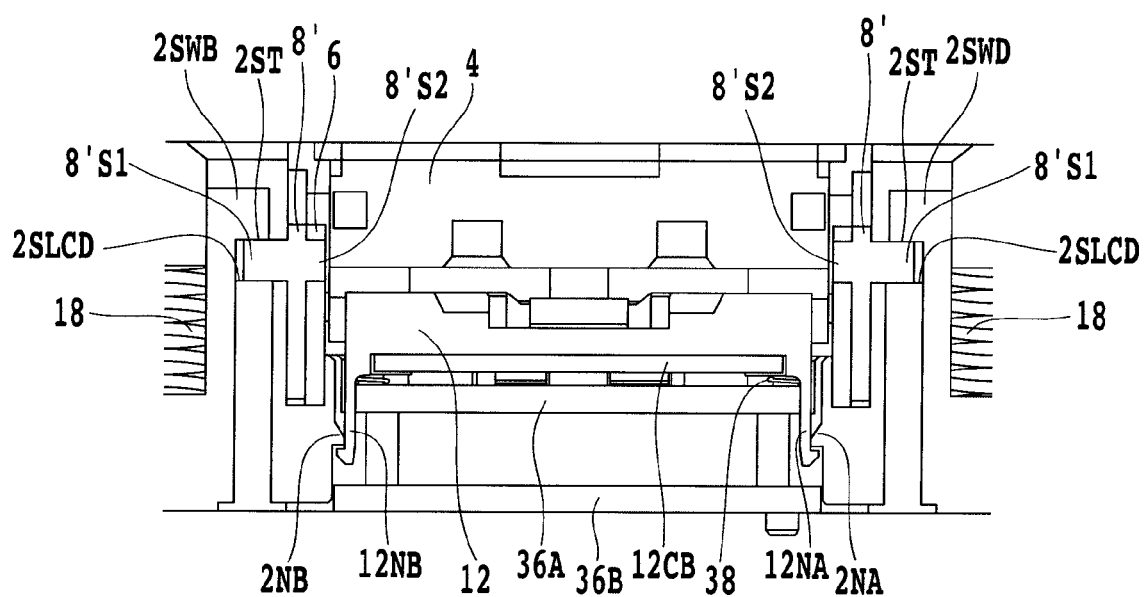
FIG. 23 is a partial sectional view showing another example of the arm member.

Although the above-described first to third embodiments include the coupling pin 16 penetrating and coupling the arm members and the lever members together, the present invention is not limited to this example. For example, as shown in FIG. 23, the arm member 8' may have coupling shaft sections 8'S1 and 8'S2. The coupling shaft section 8'S1 is engaged with and supported by circular arc surface portions 2ST of the holding wall 2SWD and 2SWB, respectively. Furthermore, the coupling shaft section 8'S2 engages with the slot 6b in the lever member 6. In FIG. 23, the same components as those in the example shown in FIG. 1 are denoted by the same reference numerals. Duplicate descriptions of these components are omitted.

What is claimed is:

1. A semiconductor device socket comprising:
a socket main body section having a semiconductor device placement section in which a plurality of semiconductor devices with different shapes and sizes are placed in a detachable manner;
a lever member having one end of which is rotationally movably supported by said socket main body section and which has an engagement section at least one of the one and other ends thereof;
an arm member coupled to the other end of said lever member via a coupling portion;
a pressing member supported by the arm member at a position closer to a tip of said arm member before a position to which the coupling portion of said arm member is coupled, said pressing member having a pressing section corresponding to the plurality of semiconductor devices with the different shapes and sizes; and
a cover member supported so as to be able to raise and lower with respect to said socket main body section and coupled to other end of said arm member,
wherein when the pressing section of said pressing member presses the semiconductor device in response to an operation of said cover member, the pressing section in a pressing state is kept resulting from one end of the coupling portion being engaged with an engagement groove in said socket main body section, and when said pressing member is in a standby state in which the pressing member keeps away from the semiconductor device placement section, the one end of the coupling portion is disengaged from the engagement groove in said socket main body section.

2. The semiconductor device socket according to claim 1, wherein when the lever member has an engagement section at the other end, further comprising a bias member for biasing the lever member in a direction in which the lever member is moved closer to the semiconductor device placement section.

3. The semiconductor device socket according to claim 1, wherein the pressing member is rotationally movably supported by the arm member.

4. The semiconductor device socket according to claim 1, further comprising a positioning member supported by the semiconductor device placement section so as to be able to raise and lower, and the positioning member being lowered when the pressing section of said pressing member is in the pressing state.

5. The semiconductor device socket according to claim 1, wherein when the lever member has an engagement section at the one end, further comprising a bias member for biasing the lever member in a direction in which the lever member is separated from the semiconductor device placement section.

6. A semiconductor device socket comprising:

a socket main body section having a semiconductor device placement section in which a plurality of semiconductor devices with different shapes and sizes are placed in a detachable manner;

a first lever member and a second lever member arranged opposite each other across the semiconductor device placement section, one end of each of said first and second lever members being rotationally movably supported by the socket main body section, each of said first and second lever members having an engagement section at least one of the one and other ends thereof;

a first arm member and a second arm member coupled to the other ends of said first and second lever members, respectively, via coupling portions;

a first pressing member supported by said first arm member at a position closer to a tip of said first arm member before a position to which the coupling portion is coupled, said first pressing member having a pressing section corresponding to the plurality of semiconductor devices with the different shapes and sizes;

a second pressing member supported by said second arm member at a position closer to a tip of the second arm member before a position to which the coupling portion is coupled, said second pressing member having a pressing section corresponding to the plurality of semiconductor devices with the different shapes and sizes; and a cover member supported so as to be able to raise and lower with respect to said socket main body section and coupled to other ends of said first and second arm members, wherein when the pressing sections of said first and second pressing members cooperatively press the semiconductor devices in response to an operation of said cover member, the pressing sections of the first and second pressing members in a pressing state are kept, resulting from one end of the coupling portion is engaged with an engagement groove in the socket main body section and when said pressing member is in a standby state in which said first and second pressing members keep away from the semiconductor device placement section, the one end of the coupling portion is disengaged from the engagement groove in said socket main body section.

7. The semiconductor device socket according to claim 6, wherein when each of the first and second lever members has an engagement section at the other end, further comprising a bias member for biasing said first and second lever members in a direction in which said first and second lever members are moved closer to the semiconductor device placement section.

8. The semiconductor device socket according to claim 6, wherein said first and second pressing members are rotationally movably supported by said first and second arm members, respectively.

9. The semiconductor device socket according to claim 6, wherein when each of said first and second lever members has an engagement section at the one end, further comprising a bias member for biasing said first and second lever members in a direction in which said first and second lever members are separated from the semiconductor device placement section.

10. The semiconductor device socket according to claim 1, wherein the engagement groove has an opening at one end such that one end of the coupling portion enters or leaves the opening.

11. The semiconductor device socket according to claim 6, wherein the engagement groove has an opening at one end such that one end of the coupling portion enters or leaves the opening.

* * * * *